United States Patent [19]
Bradley

[11] Patent Number: 6,120,669
[45] Date of Patent: Sep. 19, 2000

[54] BIPOLAR ELECTROCHEMICAL CONNECTION OF MATERIALS

[75] Inventor: Jean-Claude Bradley, Philadelphia, Pa.

[73] Assignee: Drexel University, Philadelphia, Pa.

[21] Appl. No.: 09/061,818

[22] Filed: Apr. 16, 1998

Related U.S. Application Data

[60] Provisional application No. 60/043,265, Apr. 16, 1997, provisional application No. 60/048,475, Jun. 3, 1997, provisional application No. 60/066,905, Nov. 14, 1997, and provisional application No. 60/079,722, Mar. 27, 1998.

[51] Int. Cl.[7] .............................. C25D 5/00; C25D 5/02
[52] U.S. Cl. .................. 205/114; 205/123; 205/125; 205/136; 205/147
[58] Field of Search .................... 205/114, 147, 205/118, 122, 123, 125, 136

[56] References Cited

U.S. PATENT DOCUMENTS

| | | | |
|---|---|---|---|
| 3,483,095 | 12/1969 | Bean | 205/118 |
| 3,485,725 | 12/1969 | Koretzky | 205/147 |
| 3,988,216 | 10/1976 | Austin et al. | 204/28 |
| 4,043,891 | 8/1977 | Alkire et al. | 204/231 |
| 4,437,943 | 3/1984 | Beck et al. | 205/114 |
| 4,440,800 | 4/1984 | Morton et al. | 427/459 |
| 4,517,253 | 5/1985 | Rose et al. | 428/620 |
| 4,589,959 | 5/1986 | Nakamatsu et al. | 205/147 |
| 4,648,945 | 3/1987 | Isenberg | 205/122 |
| 4,657,833 | 4/1987 | Hadley, Jr. et al. | 430/52 |
| 4,681,665 | 7/1987 | Guillermet et al. | 205/138 |
| 4,830,903 | 5/1989 | Levy | 428/209 |
| 4,914,081 | 4/1990 | Miller et al. | 505/1 |
| 4,919,971 | 4/1990 | Chen | 427/98 |
| 4,994,154 | 2/1991 | Chen et al. | 205/103 |
| 5,141,602 | 8/1992 | Chen et al. | 205/103 |
| 5,290,423 | 3/1994 | Helber, Jr. et al. | 205/114 |
| 5,315,162 | 5/1994 | McHardy et al. | 706/33 |
| 5,567,328 | 10/1996 | Engle et al. | 216/13 |
| 5,603,819 | 2/1997 | Harris et al. | 205/341 |
| 5,641,391 | 6/1997 | Hunter et al. | 205/80 |
| 5,660,706 | 8/1997 | Zhao et al. | 205/123 |
| 5,667,667 | 9/1997 | Southern | 205/687 |
| 5,681,441 | 10/1997 | Svendsen et al. | 205/114 |
| 5,686,207 | 11/1997 | Suda et al. | 430/5 |

OTHER PUBLICATIONS

F.A. Lowenheim, Electroplating, McGraw–Hill Book Co., New York, pp. 135–155, 1978.

H. Silman et al. Protective and Decorative Coatings for Metals, Finishing Publications Ltd., Teddington, Middlesex, England, pp. 296, 1978*.

(List continued on next page.)

Primary Examiner—Kathryn Gorgos
Assistant Examiner—William T. Leader
Attorney, Agent, or Firm—Akin, Gump, Strauss, Hauer & Feld, L.L.P.

[57] ABSTRACT

The present invention relates to a bipolar electrochemical process for toposelective electrodeposition of a substance on a substrate comprising (a) placing the substrate and at least one of the substance and a source of the substance into an environment capable of conducting electricity and containing electrodes; (b) aligning the substrate on which the substance is to be deposited with respect to the electrodes such that the electrodes are not in contact with the substrate and the substance will be deposited in a predetermined location on the substrate when an electric field is applied; and (c) applying a voltage to the electrodes to create an electric field of a sufficient strength between the electrodes and for a time sufficient to deposit the substance on the substrate at the predetermined location in substantial alignment with the electric field. The toposelective electrodeposition of a substance preferably comprises forming a solid electrically conductive structure, such as a wire, between at least two substrates, such as metal particles. A thin wire is formed by a spatially coupled bipolar electrochemical mechanism. The ability to create electrical contacts between conductive structures isolated from an external circuit has applications in microcircuit construction, among other fields.

22 Claims, 14 Drawing Sheets

OTHER PUBLICATIONS

C. Gurtner et al., "Selective Construction of Electrical Connections Using an Organic Charge–Transfer Salt," *Adv. Mater.*, 8(11):897–899 (1996).

C.L. Curtis et al., "Fabrication of Conducting Polymer Interconnects," *Science*, 262:2014–2016 (Dec. 24, 1993).

H.S. White et al., "Chemical Derivatization of an Array of Three Gold Microelectrodes with Polypyrrole: Fabrication of a Molecule–Based Transistor," *J. Am. Chem. Soc.*, 106:5375–5377 (1984).

G.P. Kittlesen et al., "A Microelectrochemical Diode with Submicron Contact Spacing Based on the Connection of Two Microelectrodes Using Dissimilar Redox Polymers," *Am. Chem Soc.*, 107(25):7373–7380 (1985).

Keh, H.J. et al., "Interactions among Bipolar Spheres in an Electrolytic Cell," *J. Electrochem. Soc.*, 141(11):3103–3114; (Nov. 1994).

V. Fleury et al., "Runaway growth in two–dimensional electrodeposition," *Europhysics Letters*, 36(4):253–258 (Nov. 1, 1996).

M.Z. Bazant, "Regulation of ramified electrochemical growth by a diffusive wave," *Phys. Rev. E.*, 52(2):1903–1914 (Aug. 1995).

R.H. Cork et al., "Local concentration measurments in electrochemical deposition using a schlieren method," *Phys. Rev. A*, 44(10):6940–6943 (Nov. 15, 1991).

J.N. Chazalvich, "Electrochemical aspects of the generation of ramified metallic electrodeposits," *Phys. Rev. A*, 42(12) 7355–7367 (Dec. 15, 1990).

V. Fleury et al., "Mechanism of a morphology transition in ramified electrochemical growth," *Nature*, 367:435–438 (Feb. 3, 1994).

J–C Bradley et al., "Creating electrical contacts between metal particles using directed electrochemical growth," *Nature*, 389:268–271 (Sep. 18, 1997).

R.J. von Gutfield et al., "Copper exchange plating on palladium and its relation to circuit repair," *Appl. Phys. Lett.*, 59(26):3490–3492 (Dec. 23, 1991).

G.B. Fefferman et al., "Testing Long–Term Corrosion of PC Materials," *Circuits Manufacturing*, 10–14 (1979).

J.N. Lahti et al., "The Characteristic Wearout Process in Epoxy–Glass Printed Circuits for High Density Electronic Packaging," *Proceedings of the 17th Annual Reliability Physics Symposium*, pp. 39–43 (1979).

J.P. Mitchell et al., "Conductive Anodic Filament Growth in Printed Circuit Materials," *Proceedings of the Printed Circuit World Convention, II*, pp. 80–93 (1981).

J.A. Augis et al., "A Humidity Threshold for Conductive Anodic Filaments in Epoxy Glass Printed Wiring Boards," *3rd International SAMPE Electronic Conference*, pp. 1023–1031 & Abstract (Jun. 20–22, 1989).

S. Li, "Electrochemical Processing of Conducting Polymer Fibers," *Science*, 259:957–960 (Feb. 12, 1993).

M.J. Sailor et al., "Conducting Polymer Connections for Molecular Devices," *Adv. Mater.*, 6(9):88–692 (1994).

M. Fujii et al., "Neuron–type Polypyrrole Device Prepared by Electrochemical Polymerization Method and Its Properties," *Synthetic Metals*, 71:2223–2224 (1995).

S. Cattarin et al., "Characterization and Processing of Bipolar Semiconductor Electrodes in a Duel Electrolyte Cell," *J. Electrochem. Soc.*, 142(11):3786–3792 (Nov. 1995).

S. Catterin et al., "Photoelectrochemistry at bipolar semiconductor electrodes," *J. Chim Phys.*, 93:650–661 (1996).

R.J. von Gutfield et al., "Copper microcircuit repair of opens using thermally driven exchange plating," *Appl. Phys. Lett.*, 56(25):2584–2586 (Jun. 18, 1990).

N. Nishizawa et al., "Metal Nanotubule Membranes with Electrochemically Switchable Ion–Transport Selectivity," *Science*, 268:700–702 (May 5, 1995).

C.R. Martin, "Nanomaterials: A Membrane–Based Synthetic Approach," *Science*, 266:1961–1966 (Dec. 24, 1994).

C.A. Huber et al., "Nanowire Array Compositites," *Science*, 263:800–802 (Feb. 11, 1994).

W. Li et al., "Nanometer–scale electrochemical deposition of silver on graphite using a scanning tunneling microscope," *Appl. Phys. Lett.*, 60(10):1181–1183 (Mar. 9, 1992).

L. Mirkova et al., "Anodic behavior of copper during electrorefining using a rotating ring–disc electrode," *Journal of Applied Electrochemistry*, 24:420–425 (1994).

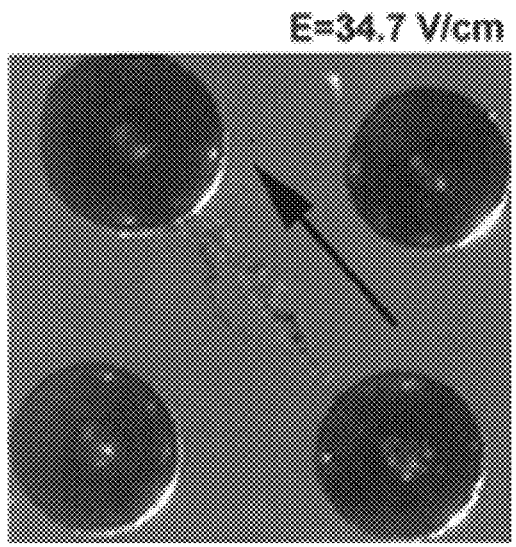 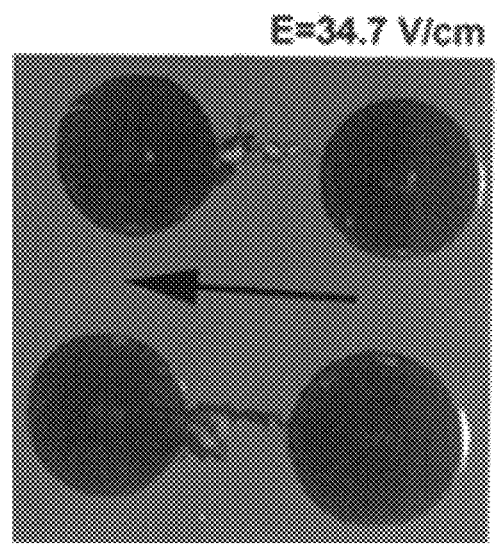
FIG.4A  FIG.4B
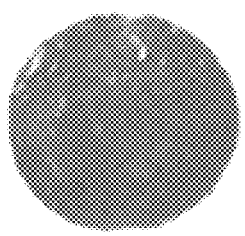 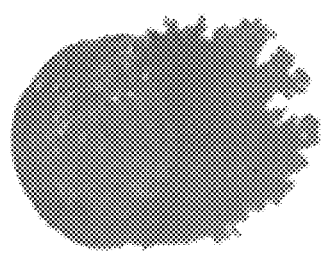
FIG.5A  FIG.5B

⊢—22mm

BIPOLAR ELECTROCHEMICAL CONNECTION OF MATERIALS

CROSS-REFERENCE TO RELATED APPLICATIONS

This application claims the benefit of Provisional Application No. 60/043,265, filed Apr. 16, 1997, Provisional Application No. 60/048,475, filed Jun. 3, 1997, Provisional Application No. 60/066,905, filed Nov. 14, 1997, and Provisional Application No. 60/079,722, filed Mar. 27, 1998.

BACKGROUND OF THE INVENTION

This invention relates to site-selective (toposelective) electrodeposition of a substance on a conductive component through the application of an electric field. More particularly, it is directed to such toposelective electrodeposition using bipolar electrochemistry. Applications include, by way of example but not limitation, site-directed partial or complete plating of a conductive substance, such as metal, conductive polymer or conductive salt, or a nonconductive substance, such as an electropolymerizable but nonconductive polymer, salt or adsorbate, on another material, such as a metallic particle; forming, in a manner analogous to "growing" a wire between two conductive contacts, where the wire formation may be three-dimensional; and forming electrical conductors on circuit boards or other electronic supports.

The construction of conductive paths represents a key element in electric circuitry and particularly in microcircuit fabrication. Photolithography and screen printing are currently the most widely used methods for creating circuitry on flat surfaces on most scales of commercial importance. For interconnect applications where coplanarity is not easily achieved, microsoldering or the application of a conductive adhesive is frequently employed. These approaches necessitate careful positioning of the soldering tool and physical contact with the circuitry.

There is a recent trend in materials science attempting to establish selective electrical contacts between conductive components without resorting to photolithographic techniques. To escape the limitations of planar circuit designs and to avoid physical contact, several novel approaches to circuit construction have been developed.

One such approach involves electrocrystallization (C. Gurtner, M. J. Sailor, *Adv. Mater.* 8:897 (1996)), or electropolymerization (C. L. Curtis, J. E. Ritchie, M. J. Sailor, *Science*, 262:2014 (1993)), from adjacent electrodes until an electrical connection is achieved by random physical contact of the growing conductive polymer or salt. In this way it has been possible to create conductive polymer-based diodes, transistors and signal amplifiers. (H. S. White, G. P. Kittlesen, M. S. Wrighton, *J. Am. Chem. Soc.* 106:5375 (1984)).

Other researchers have employed other techniques or strategies to construct conductive paths, such as templates (Nishizawa, M.; Menon, V. P.; Martin, C. R. *Science* 1995, 268, 700); or on the surface of microelectrodes (G. P. Kittlesen, H. S. White; M. S. Wrighton *J. Am. Chem. Soc.* 107, 7373 (1985); (Martin, C. R. *Science* 1994, 266, 1961; Huber, C. A.; Huber, T. E.; Sadoqi, M.; Lubin, J. A.; Manalis, S.; Prater, C. B. *Science* 1994, 263, 800); scanning tunneling microscopy (W. Li, J. A. Virtanen, R. M. Penner *Appl. Phys. Lett.* 60, 1181 (1992)); thermally-driven strategies (von Gutfeld, R. J.; Vigliotti, D. R. *Appl. Phys. Lett.* 1990, 56, 2584); and contact electrodeposition strategies (Beck, A. F., Winter, J. U.S. Pat. No. 4,437,943). Rapid circuit prototyping has also been achieved with the use of "anti-fuses" which are activated by high applied potentials (Stopper, H.; Banker, J.; Miller, R. *Proceedings of IMAPS International Conference on Multichip Modules,* Denver, Col. Apr. 19–21, 1995, 191).

A major advantage of these approaches over photolithographic techniques is the possibility of forming contacts in three dimensions, thus greatly increasing the available information processing density currently available on two dimensional circuitry.

An electric field induces polarization in conductive particles. Beyond a critical polarization, the overpotential at the surface of the particle becomes sufficiently elevated to induce electrochemistry. Since each particle serves as both anode and cathode, the process is referred to as bipolar electrochemistry. This phenomenon has been investigated using fluidized or packed bed electrodes for applications in metal recovery, electrosynthesis and ultramicroelectrode studies. The technique is particularly well suited for electrochemistry in low conductivity media.

The process of this invention is based on bipolar electrochemistry and many aspects are based on spatially coupled bipolar electrochemistry (SCBE). SCBE is best explained by example. When a pair of electrodissolvable substances, such as copper particles, rings or the like are exposed to an electric field, they become polarized, even if they are not contacted by the electrodes forming the anode and cathode. At sufficiently elevated electric fields, material resulting from electrodissolution of the electrodissolvable substance, such as copper, for example, from one particle aligned with the electrodes becomes spatially coupled via electrodeposition on the other particle aligned with the first particle and the electrodes, resulting in the formation of a conductor or wire between the particles. Even without direct contact between at least one electrode and the particle and preferably, without any contact between either of the electrodes and the particles, and further, without initial contact between the particles, spatial coupling occurs between the particles. Thus, it has been discovered that the electrochemical phenomena between the particles are governed solely by the electric fields generated between the electrodes. SCBE allows the growth of conductive structures on isolated components, where contact with either or both electrodes is not required, with the location of the growth of the conductive substance being controlled by the electric field direction, rather than by contact of the electrodes with either or both particles involved in the reaction.

The present invention demonstrates that bipolar electrochemistry and SCBE are viable techniques for forming robust and adherent electrical connections in electric circuitry, including microcircuitry, involving forming (in essence, "growing") conductors using commercial circuit boards. An especially powerful feature of this invention is the formation of wires much smaller than the metallic components initially present without having to resort to photolithographic methods. The ability to predict and control wire growth between metallic or other electrodissolvable structures not directly connected to an external circuit represents a simple and cost effective approach to microcircuitry, including three dimensional microcircuit building. Selective wire formation within a matrix-bound ensemble of conductive components should be achieved by using three dimensional microelectrode arrays or even by the local electric field generated by linearly polarized light focused on a selected volume within the matrix. The use of a matrix may effectively reduce the fragility of the wires.

The disclosures of each of the references cited herein are hereby incorporated herein by reference.

BRIEF SUMMARY OF THE INVENTION

One aspect of the present invention relates to a bipolar electrochemical process for toposelective electrodeposition of a substance on a substrate comprising (a) placing the substrate and at least one of the substance and a source of the substance into an environment capable of conducting electricity and containing electrodes; (b) aligning the substrate on which the substance is to be deposited with respect to the electrodes such that the electrodes are not in contact with the substrate and the substance will be deposited in a predetermined location on the substrate when an electric field is applied between the electrodes; and (c) applying a voltage to the electrodes to create an electric field of a sufficient strength between the electrodes and for a time sufficient to deposit the substance on the substrate at the predetermined location in substantial alignment with the electric field.

Another aspect of the invention relates to a bipolar electrochemical process for toposelective formation of an electrically conductive structure between at least two substrates comprising (a) placing a source of electrically conductive material and the substrates into an environment capable of conducting electricity and containing electrodes; (b) aligning the substrates with respect to the electrodes such that the electrodes are not in contact with the substate and the material will form a conductive structure between the substrates when an electric field is applied between the electrodes; and (c) applying a voltage to the electrodes to create an electric field of a sufficient strength between the electrodes and for a time sufficient to form the electrically conductive structure between the substrates, the electrically conductive structure being substantially aligned with the electric field.

Still another aspect of the invention relates to a bipolar electrochemical process for toposelective formation of a solid electrically conductive structure between at least two substrates on a circuit board, at least one of the substrates comprising a source of electrically conductive material, the process comprising (a) placing the circuit board and, the substrates into an environment capable of conducting electricity and containing electrodes; (b) aligning the substrates with respect to the electrodes and the circuit board such that the material will form a solid electrically conductive structure between the substrates on the circuit board when an electric field is applied between the electrodes; and (c) applying a voltage to the electrodes to create an electric field of a sufficient strength between the electrodes and for a time sufficient to form, toward the substrate comprising the source of electrically conductive material, the solid electrically conductive structure on the circuit board between the substrates, the solid electrically conductive structure being substantially aligned with the electric field. In this aspect of the invention, where the environment is a liquid electrically conductive environment, the process further preferably comprises drying the circuit board on which the electrically conductive structure was formed to adhere the structure to the circuit board, and then electrolessly plating the same or a different electrically conductive material onto the electrically conductive structure until a desired thickness of the electrically conductive structure between and in contact with the substrates is obtained.

Yet another aspect of the invention relates to a bipolar electrochemical process for toposelective formation of an electrically conductive structure between at least two substrates, at least one of the substrates comprising a source of electrically conductive material, the process comprising (a) placing the substrates into an environment capable of conducting electricity and containing electrodes; (b) aligning the substrates with respect to the electrodes such that the material will form a conductive structure between the substrates when an electric field is applied between the electrodes; and (c) applying a voltage to the electrodes to create an electric field of a sufficient strength between the electrodes and for a time sufficient to form, toward the substrate comprising the source of electrically conductive material, the electrically conductive structure between the substrates, the electrically conductive structure being substantially aligned with the electric field. Preferably, the electrically conductive structure is in contact with the substrates.

BRIEF DESCRIPTION OF THE SEVERAL VIEWS OF THE DRAWINGS

The foregoing summary, as well as the following detailed description of preferred embodiments of the invention, will be better understood when read in conjunction with the appended drawings. For the purpose of illustrating the invention, there is shown in the drawings embodiments which are presently preferred. It should be understood, however, that the invention is not limited to the precise arrangements and instrumentalities shown. In the drawings:

FIG. 4 comprises photomicrographs, FIGS. 4A and 4B, showing the ability to control wire growth within a 4×4 particle array, where the direction of the electric field vector is indicated by the arrows. A bar indicates the scale of 1,000 microns ($\mu$m).

FIG. 5 comprises two photomicrographs, FIG. 5A and FIG. 5B. FIG. 5A depicts the starting condition of a gold particle about to be subject to bipolar electrodeposition of polypyrrole under bipolar electrochemical conditions according to the present invention. FIG. 5B depicts the electrodeposition of polypyrrole on the gold particle after five minutes. The arrow indicates the field direction, where the field direction is from the positive electrode (anode) to the negative electrode (cathode).

FIG. 16 comprises photomicrographs FIGS. 16A–16F showing a top view of the formation of wires between the rings which were made more robust by electroless plating of copper, as explained in Example 8.

DETAILED DESCRIPTION OF THE INVENTION

Figure 1A:
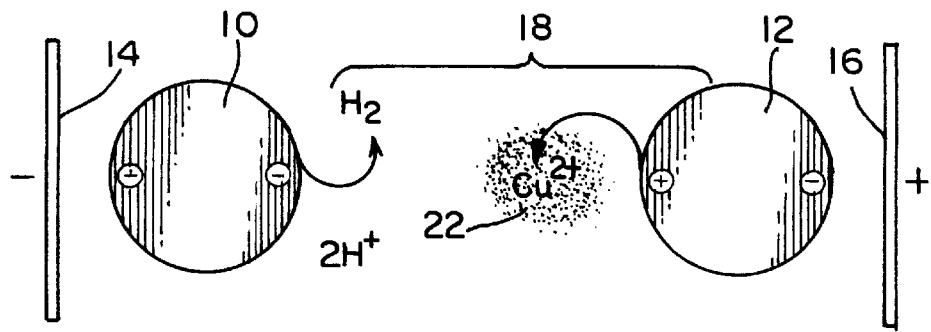
FIG. 1 comprises conceptual schematic diagrams, FIGS. 1A–1D, illustrating wire formation between two particles under bipolar electrochemical conditions according to the present invention.

One aspect of the present invention relates to a bipolar electrochemical process for toposelective electrodeposition of a substance on a substrate comprising (a) placing the substrate and at least one of the substance and a source of the substance into an environment capable of conducting electricity and containing electrodes; (b) aligning the substrate on which the substance is to be deposited with respect to the electrodes such that the electrodes are not in contact with the substrate and the substance will be deposited in a predetermined location on the substrate when an electric field is applied between the electrodes; and (c) applying a voltage to the electrodes to create an electric field of a sufficient strength between the electrodes and for a time sufficient to deposit the substance on the substrate at the predetermined location in substantial alignment with the electric field.

The substance to be connected to the substrate may be any substance that is capable of generating a conductive structure. A substance that is capable of generating a conductive structure is a metal ion that will electrodeposit in a conductive form such as a metal or metal oxide, a monomer which will electropolymerize into a conductive polymer, or an organic salt which electrocrystallizes into a conductive crystal. Any substance that is electrodissolvable in the electrically conductive environment may be used as the substance to be electrodeposited on the substrate. The ions of any metal and silicon are suitable in an appropriate environment, as set forth below. Preferred are ions of Cu, Ag, Au, Pd, Pt, Co, Ni, Zn, In, Ga, Fe, Pb, Al, W, Ir, Cr, Cd, Re, Os, Mn and Sn. Ions of Cu and Ag are more preferred.

Concerning electropolymerizable monomers, pyrrole and its derivatives, thiophene and its derivatives and aniline and its derivatives are preferred. Pyrrole is currently the most preferred electropolymerizable monomer. The preferred electrocrystallizable organic salt is a salt of tetrathiafulvene, although others would be known to those skilled in the art.

The substrate to receive the substance may be any electroconductive material. The substrate may be, for example, a metal or metal oxide, a conductive polymer or a conductive organic salt crystal, a conductive form of carbon (such as graphite or forms of conductive diamond) and any other doped semiconductor material (such as silicon, InP, GaAs, CdS, CdSe, and the like). The more preferred substrate material is Cu, Ag, Au or Pt.

The environment capable of conducting electricity is usually, but not exclusively, a liquid environment. Suitable environments include gases or even solids (e.g., ice or porous substances) so long as they have a dielectric constant lower than the conductive substrates and can solvate the electrodepositable substance in a form in which it can electrodeposit onto the conductive substrate upon application of an electric field.

Preferably the environment is a liquid or gel having the characteristics for the environment set forth above. The liquid or gel may contain additives such as an acid to remove oxides, a surfactant to prevent adhesion of gas bubbles, such as hydrogen gas that may be evolved, or other beneficial and optional additives.

When the electrodepositable substance is pyrrole, then a compound which induces or enhances conductivity of the polypyrrole should be present, such as sodium para-toluenesulfonate, on the order of about 0.1 mM to about 0 mM.

The choice of the environment depends on the type of metal or other electrodepositable substance, and the substrates used. One skilled in the art would be able to determine which environment is suitable for the situation based on electrochemical qualities involved in electrodissolution and electrodeposition. For example, in the case of copper and silver, the preferred environment is an aqueous solution containing up to 1 mM acid, preferably sulfuric acid, and up to 0.1 mM surfactant, preferably a nonionic surfactant, or an organic solution, preferably an acetonitrile/toluene mixture containing up to about 80 vol % toluene.

The electrodes may be any electrically conductive material connected to a voltage source, preferably a material that does not electrodissolve in the environment of the process. Gold, platinum and graphite are the preferred electrode materials. There may be instances where electrodissolvable electrodes are desired, however, where it is desired to deposit electrode material on the substrate, for example.

The present invention is based upon bipolar electrochemistry which has as an advantage over other methods of electrodeposition or other such techniques, the ability to apply toposelective electrodeposition to particular target areas of substrates by the appropriate alignment of the substrate within the applied electric field. The alignment of the electric field is achieved by appropriately aligning the substrates with respect to the electrodes (or the converse, aligning the electrodes with respect to the substrates) and to the source of the substance or material to be electrodeposited (which as explained below, may be one of the substrates where there is more than one substrate). In bipolar electrochemistry, the substance to be deposited is placed in alignment with the electric field vector between the cathode or negative electrode and the anode or positive electrode such that the electrodeposition takes place in a direction from the cathode to the anode. Thus, very site-selective electrodeposition can be achieved without contacting the substrate in any way with the electrodes or without contacting the substrate in advance with the substance to be deposited.

The effect of the bipolar electrochemical process of this invention is illustrated schematically in FIG. 1 with respect to electrodissolvable substrates, which also act as the source of the electrodepositable substance. Spherical copper particles 10, 12 are chosen for illustrative purposes. They are aligned between a cathode 14 (− charge) and an anode 16 (+ charge). As shown in FIG. 1A, each particle acts as both an anode and a cathode when an electric field is applied. Upon application of an electric field (which has a field vector in the direction from the anode to the cathode), on particle 12, electrochemical oxidation of copper to cupric ions occurs (Mirkova, L.; Rashkov, S. J. *Appl. Electrochem.* 24:420 (1994)), liberating copper ions, while electrochemical reduction of water occurs at the other particle 10. After a certain time, as shown in FIG. 1B, the concentration of copper ions in the interparticle space 18 increases sufficiently so that electrodeposition competes with the reduction of water. The shaded area 22 represents a hypothetical distribution of the ionic cloud. (For clarity, only the phenomena in the interparticle region are shown).

Figure 1B:
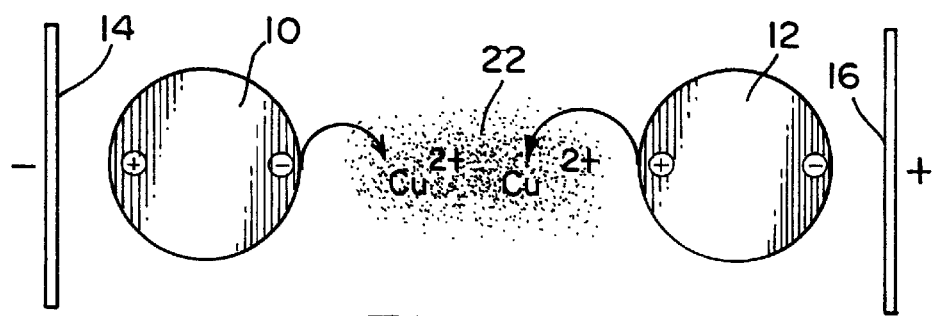
Figure 1C:
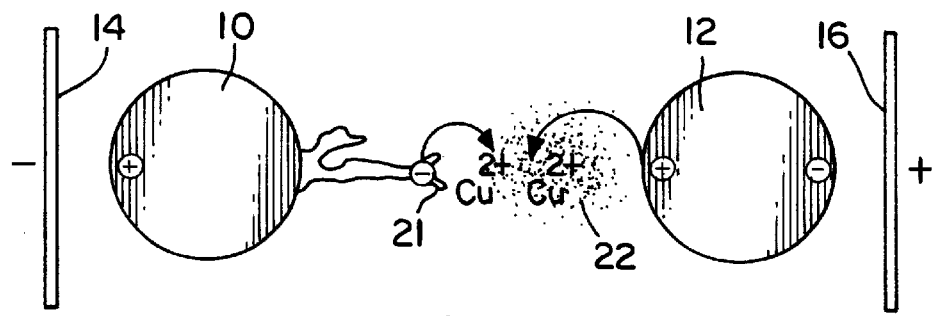

FIG. 1B shows that when the copper ion concentration near particle 10 is high enough, electrodeposition occurs and a wire 20 begins to grow toward the other particle 12, as shown in FIG. 1 C. The result is the formation of fractal wires 20 which grow toward the nearest point on the other particle's surface. Electrodeposition occurs preferentially at the wire tip 21 where cathodic polarization is expected to be highest, as shown in FIG. 1C. If one of the particles is placed too near the cathodic feeder electrode 14, a wire will form between the particle and the electrode. This can easily be avoided by ensuring that the distance between the cathodic feeder electrode and the nearest particle is much larger than the interparticle distance.

Figure 1D:
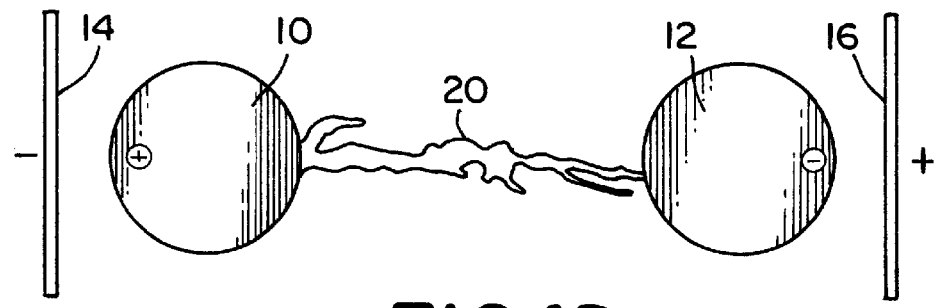

When the wire 20 reaches the particle 12, electrical contact is made as depicted in FIG. 1D. Once the wire spans the gap, electrical contact is achieved and all electrochemical phenomena between the particles instantly cease since the potential difference has been abolished, at least in aqueous media.

The SCBE technique illustrated schematically in FIG. 1 results in actual wire growth between copper particles as explained below in Example 1. The results of the experiment correlate well with the schematic.

A similar schematic arrangement is illustrated in FIG. 19. In FIG. 19, instead of using spherical copper particles, the substrates are in the form of rings having a square outer periphery and a circular central opening (the shape will be referred to hereinafter as "square rings" or "square copper rings"). While the rings are square rings, they could be round rings having a circular outer periphery.

In FIG. 19, square rings 24 and 28 are provided in an appropriate medium, and for the purpose of FIG. 19, the medium will be a medium of organic solvents, rather than an aqueous medium. Rings 24 and 28 include respective central holes 26 and 30. Aligned within the central hole of ring 24, but not touching the ring, is an electrode 32 which may be a platinum electrode, and, for the purpose of this illustration, is shown to be a cathode. Likewise, an electrode 34 is located within the hole 30 of the ring 28, and for the purpose of this illustration, electrode 34 is the anode. The polarization of the respective rings 24 and 28 is indicated. The electrodes may be located within the holes or centrally aligned under the holes. Both are effective as explained with respect to experimental results discussed below.

Figure 19A:
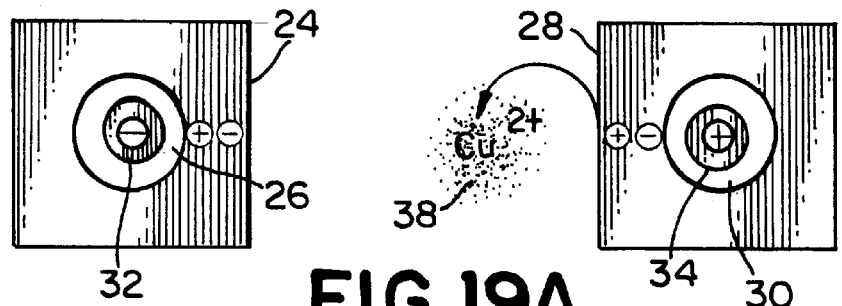
FIG. 19 comprises conceptual schematic diagrams, FIGS. 19A–19D, illustrating wire formation between copper rings having a square external shape and a circular ring wherein the electrodes are placed within the central holes not in contact with the ring. The arrangement was subjected to bipolar electrochemical conditions according to the present invention.
Figure 19B:
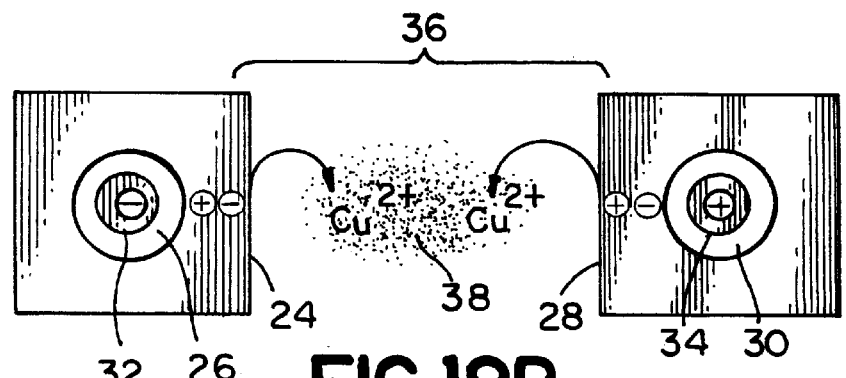
Figure 19C:
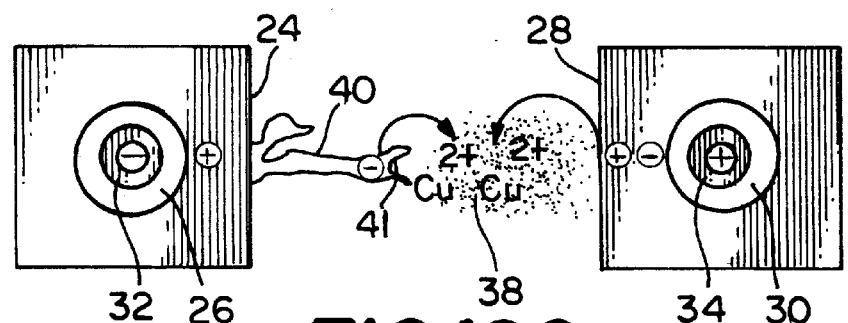
Figure 19D:
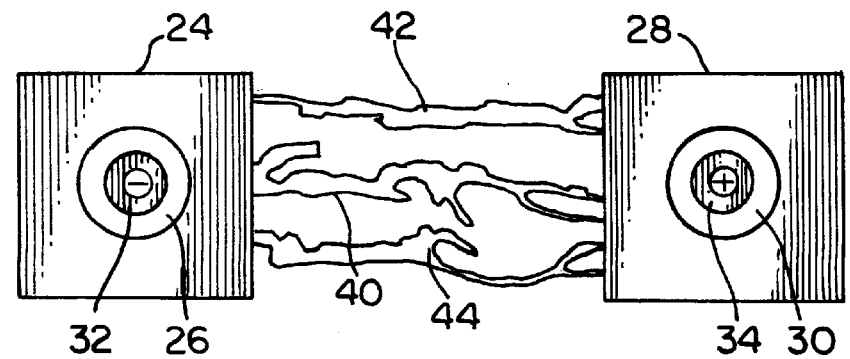

When an electric field is applied, as in the case with the spheres of FIG. 1, and as noted in FIG. 19A, the ring 28 initially liberates copper ions while the ring 24 reduces solvent in the intersubstrate space 36. A hypothetical distribution of ionic cloud is illustrated at 38. When the copper ion concentration near the ring 24 is high enough, electrodeposition occurs as illustrated in FIG. 19B, and a wire-like copper deposit begins to grow toward the ring 28, as illustrated in FIG. 19C. FIG. 19C illustrates that electrodeposition occurs preferentially at the wire tip 41 where cathodic polarization is expected to be highest.

The process continues until the wire 40 spans both rings 24 and 28. However, unlike the situation with respect to FIG. 1 when an aqueous medium is used and where wire growth thereby ceases, when an organic medium is used, wire growth continues, resulting in thicker wires and more wires, such as wires 42 and 44. Wires continue to grow until almost the entire space between the rings appears to be filled with filaments. While the exact reason for this is not known, it is believed that this behavior is the result of considerably higher resistance of the initially formed connection in the organic solvent than the one formed in the aqueous medium. This may be due to a lower quality deposit or perhaps to the formation of an insulating film on the surface of the anodic ring. The shape of the ring does not appear to have an effect upon continued wire growth. Rather, it is the type of medium that is important, since the use of square rings in an aqueous medium behave the same as the spherical particles in an aqueous medium.

As noted above, the present invention is not limited to bipolar electrodeposition of metallic substances on metallic substrates. The following information relates to the application of bipolar electrodeposition to conductive polymer systems to bridge isolated conductive components.

This embodiment of the invention is exemplified by the bipolar electrodeposition of polypyrrole onto one or two gold particles. Specific details relating to this system are set forth below in Examples 4 through 6. Two special aspects are involved in the conditions used. First, a highly resistive medium is used to allow application of high electric fields and promote ramified (branched) growth (as opposed to film formation). This is achieved by using a large volume fraction, such as about 50% by volume, of a low conductivity solvent, such as toluene, and by keeping the salt concentration low. Some salt must be present to aid in the electrical conduction of the conductive polymer. If the concentration is too low, the electrical conductivity of the growing polymer will be too low and electrodeposition will not occur. If the salt concentration is too high, it will not be possible to have a high enough electric field.

Second, when a bridging conductive polymer structure is grown, the conductive substrate must not electrodissolve into a soluble material in the region between the two conductive substrates in a form which then redeposits on the other conductive substrate. This does not apply to single isolated conductive substrates or where methods are used which would remove the electrodissolved material between the two conductive substrates, such as stirring the medium. In this exemplary embodiment, gold is used because it does not electrodissolve under the conditions used. With the same experimental design, both copper and silver produce wires of metal (or derivatives therefrom, such as copper oxide or silver oxide), instead of the growth of conductive polymer, because these metals electrodissolve under the conditions used. Whether a metal, conductive polymer or other conductive substance will electrodissolve can be readily ascertained. For example, the metal or other conductive substance can be tested in the absence of the conductive polymer. If a wire grows, the material will electrodissolve. In the case where the growth of polypyrrole must be distinguished from the growth of metal, such as copper or silver (or their oxides, for example), it is possible to distinguish between them based on the direction of wire growth. Metal deposits grow from the negatively polarized region on the substrate, and the conductive polymer (here, polypyrrole) grows from the positively polarized region on the substrate, under the conditions described below.

The formation of bipolar electropolymerized deposits to form apparent connections between isolated conductive structures should find general applicability, provided that conditions are used which favor the growth of the polymer instead of the growth of the metal. Under the conditions described in Examples 4–6 below, the method should apply easily to conductive structures that do not liberate subsequently electrodepositable materials, except where the methods used remove such materials as discussed above. Examples of suitable conductive structures for use as the substrates include graphite, platinum, doped silicon, conductive polymer structures, etc. Other electropolymerizable materials besides pyrrole include, for example, thiophene and its derivatives, aniline and its derivatives and other derivatives of pyrrole.

A second aspect of the invention relates to a bipolar electrochemical process for toposelective formation of an electrically conductive structure between at least two substrates, at least one of the substrates comprising a source of electrically conductive material, the process comprising (a) placing the substrates into an environment capable of conducting electricity and containing electrodes; (b) aligning the substrates with respect to the electrodes such that the material will form a conductive structure between the substrates when an electric field is applied between the electrodes; and (c) applying a voltage to the electrodes to create an electric field of a sufficient strength between the electrodes and for a time sufficient to form toward the substrate comprising the source of electrically conductive material the electrically conductive structure between the substrates, the electrically conductive structure being substantially aligned with the electric field. Preferably, the electrically conductive structure is solid and in contact with both substrates.

This aspect of the invention relates to a practical method of forming a solid electrically conductive structure, analogous to a wire, between at least two substrates. The substrates are of the same type of materials discussed above with respect to the first aspect of the invention relating to the electrodeposition of the substance on a substrate.

This aspect of the invention typically uses bipolar electrochemistry to form electrical contacts between metal particles or other substrates physically isolated from an external circuit. Toposelective electrodissolution and electrodeposition are spatially coupled to generate a conductive structure, such as a wire, at predictable and highly selective locations. The wire or other electrically conductive structure typically, but not necessarily, is an outgrowth from the electrochemical action on the materials forming the substrates themselves. Thus, the "source of electrically conductive material" referred to in this aspect of the invention may include the material of the substrates themselves or the material of one substrate if the substrates are made of different materials. Alternatively, the "source of electrically conductive material" may be from a third material, such as that defined for the first aspect.

A more specific adaptation of this second aspect relates to the formation of a solid electrically conductive structure between at least two substrates on a circuit board, where at least one of the substrates comprises a source of electrically conductive material. This aspect comprises (a) placing the circuit board and the substrates into an environment capable of conducting electricity and containing electrodes; (b) aligning the substrates with respect to the electrodes and the circuit board such that the material will form a solid electrically conductive structure between the substrates on the circuit board when an electric field is applied between the electrodes; and (c) applying a voltage to the electrodes to create an electric field of a sufficient strength between the electrodes and for a time sufficient to form, toward the substrate comprising the source of electrically conductive material, the solid electrically conductive structure on the circuit board between the substrates, the solid electrically conductive structure being substantially aligned with the electric field.

This adaptation may be used for macro circuits, but it has very considerable value in forming micro circuits, where there is a need to form wires of sub-micron diameter, sometimes between hard-wired circuitry or on the surface of metallic or other electrodissolvable particles themselves only a few microns in diameter. Such particles may be embedded within or otherwise adhered to a surface of a substrate, such as an electronic circuit board.

Although SCBE has proven successful on particles greater than 100 $\mu$m in water, the higher fields required to carry out the process at smaller particle dimensions were such that an organic environment, rather than an aqueous environment is preferred. If desired, a substrate can be used that is capable of immobilizing particles in the micron-size range. A suitable type of substrate is a commercial circuit board, such as that available from Radio Shack, that should be demetallized with 50% nitric acid. Copper particles can be deposited by evaporation of a suspension of powdered particles. Electrodes are aligned with the circuit board either on the sides of the circuit board or by threading wires through the holes within a circuit board such that the adhered copper particles are aligned between the electrodes.

The constructed unit may be then placed in an appropriate nonaqueous medium around the bipolar electrochemical process. The details of this type of an arrangement are set forth below in Example 7. In general, however, bipolar electrochemistry is more efficient in low dielectric constant media. This effect stems from the reduced polarization of conductive particles in high dielectric constant media and in the miniaturization of parasitic faradaic currents occurring at the feeder electrodes which limit the maximum fields which can be applied. In this submicron range, it was not possible to grow wires in highly polar solvents such as water or methanol. Acetonitrile and acetonitrile/toluene mixtures were found to be suitable. Both acetonitrile and toluene may be distilled from calcium hydride. It is believed that in very low dielectric constant media, wires do not form, either due to the inability to electrodissolve the particles or transport the electrodissolvable substance such as copper, in soluble, ionic form. Wires of very small cross sectional diameter, on the order of about 0.3 $\mu$m to about 0.5 $\mu$m have been formed as reported in Example 7.

When constructing circuits using bipolar electrodeposition, the wires formed between the substrates are often rather fragile and cannot withstand significant handling. This problem can be overcome by applying an electroless plating onto the wires formed by the bipolar electrochemical process, such as SCBE. When the wires formed by the bipolar techniques of this invention are plated with an electroless plating, they become robust and can withstand significant handling without disrupting conductivity. This then is another aspect of the present invention.

In this aspect, where the bipolar electrochemical environment is a liquid electrically conductive environment, the process further preferably comprises drying the circuit board on which the electrically conductive structure was formed to adhere the structure to the circuit board, and then electrolessly plating the same or a different electrically conductive material on the electrically conductive structure until a desired thickness of the electrically conductive structure is obtained.

The solid electrically conductive structure, typically in the form of wires, can be grown between substrates, for example metal contact points, or locations on a circuit board. To assure adherence of the wire to the circuit board, the drying step is preferred. The electroless plating step coats the wire or other electrically conductive structure with another metal or the same metal used to form the electrically conductive structure or wire. The result is the formation of a robust, adherent and conductive wire between the structures on the circuit board.

Various specific processes can be used to accomplish the formation of the conductor on the circuit board, but two techniques are presently preferred. In the first preferred technique, when holes are present through the circuit board, the electrodes can be positioned directly underneath or inside the holes. The application of a potential then generates a wire or other conductive structure between the two structures closest to the electrodes. In the second preferred technique, a piece of the circuit board is placed in an electric field generated by the two electrodes positioned parallel to the circuit board edge. The electric field vector causes the growth of a wire between the structures closest to the electrodes. In both of these techniques, an electrically conductive environment, such as water or other aqueous solution or an organic solution, must be present between the electrodes and the conductive structures on the circuit board. As before, any solvent which is suitable for carrying out electrochemistry could be used. In the presence of a suitable component in the solvent or other environment used to carry out the formation of the electrically conductive structure, it should be possible to prepare a wire composed of any electroplatable metal or conductive substance, such as conductive polymers or conductive salts.

The present invention will now be described in more detail with reference to the following specific, non-limiting Examples.

EXAMPLE 1

This Example demonstrates the effect of different conditions upon the formation of wires between two copper particles using SCBE according to the invention.

Two spherical copper particles were aligned perpendicular to two Pt electrodes in an aqueous medium. Except for the study represented by FIG. 2I, in which the medium was modified as indicated below, the medium contains water, acid ($H_2SO_4$, 0.01 mM), and surfactant (a nonionic surfactant, Nonidet-P40 (Sigma), 0.01%, to prevent hydrogen bubbles from sticking to the copper particles.

FIG. 2 is a series of photomicrographs showing the formation of electrically conductive wires under various conditions described below. The results are consistent with the schematic illustration of FIG. 1 and its description above.

Figures 2A, 2F:
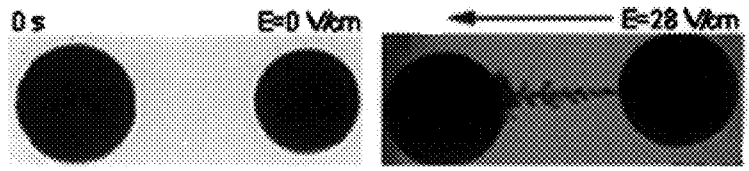
FIG. 2 comprises photomicrographs, FIGS. 2A–2J, illustrating the formation of wires between two copper particles under several different conditions. A bar indicates the scale of 1,000 microns ($\mu$m).
Figures 2B, 2G:
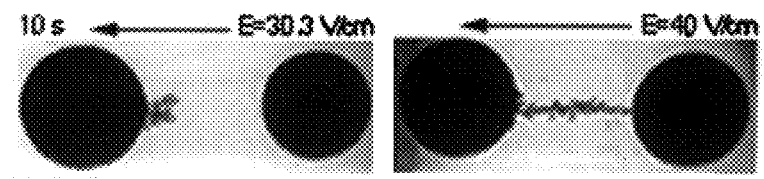

FIG. 2A illustrates wire formation between two copper particles before application of a 30.3 V/cm field in the direction indicated by the black arrow. During the initial growth period, several wires were frequently observed growing in parallel. Several wires begin to grow on the left particle after a 10 second ("s") incubation period, as shown in FIG. 2B.

Figures 2C, 2H:
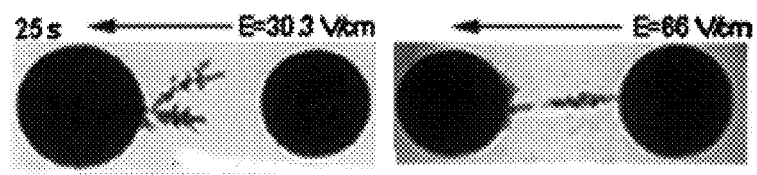
Figures 2D, 2I:
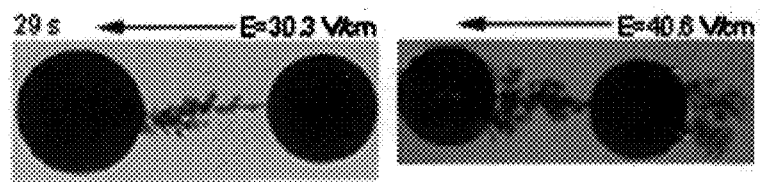

Competitive with this process was the repetitive branching of the growing wire, generating a pseudo-steady state of growing parallel branches generally connected to the same "trunk." FIG. 2C shows that two competing wire branches survive to the interparticle midpoint 25 s after the application of the field. A positive feedback mechanism seemed to take place, whereby the wire which was slightly ahead would grow faster than the others, effectively shielding the others from the field and presumably depleting the local copper ion concentration. FIG. 2D shows that only one branch survives and spans the interparticle gap 29 s after the application of the field. The surviving branch establishes electrical contact between the two particles. Notice the great acceleration in growth velocity as the wire approaches the second particle.

Ultimately, the first branch to reach the other copper particle would close the circuit and all growth would cease instantly. As long as the field remained, the wire exhibited a self-healing behavior. If the wire was broken at any point due to a slight movement caused by tapping the microscope stage-plate, a quick regrowth was observed, unless the movement had caused complete detachment of the wire from both particles.

FIGS. 2E–2H illustrate the effect of wires grown at increasing field strengths. Notice the reduction in branching and wire width with increasing field strength.

In the presence of externally added copper salts, wire growth was observed to occur not only between the particles, but also from the particle facing the anodic feeder electrode. FIG. 2I shows that a wire grown between two particles with externally added 2.5 mM $Cu(NO_3)_2$ forms a thick bush between the particles and on one side of the particle closest to the feeder anode, instead of a thin wire forming exclusively between the particles (compare FIGS. 2G and 2I).

FIGS. 2A–2H, compared to FIG. 2I, indicate that the highly localized copper ion distribution in the interparticle space ensures that a wire will form exclusively between the particles. The ion localization had the added benefits that the overall conductivity of the solution could be kept low and electrodeposition of copper on the cathodic feeder electrode was minimized.

Figures 2E, 2J:
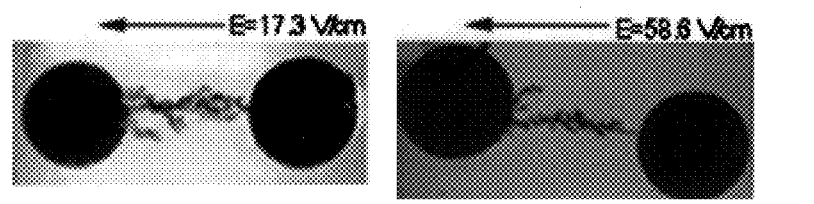

Distortion of the electric field by the two particles and the ensuing self-focusing behavior could be observed by slanting the two particles relative to the external field. FIG. 2J illustrates a wire grown between two slightly slanted particles with respect to the external field, showing that the shortest possible route was taken.

The field distortion by two or more conducting spheres and the ensuing increase in conductivity at the particle surface under bipolar conditions has recently been calculated numerically (Keh, H. J.; Li, W. J. *J. Electrochem. Soc.* 141:3103 (1994)). However, the growth of fractal wires on the surface of one particle introduces significant complications in the calculation of the field distortion. This process is further complicated by the highly inhomogeneous copper ion distribution in the medium.

EXAMPLE 2

Figure 3:
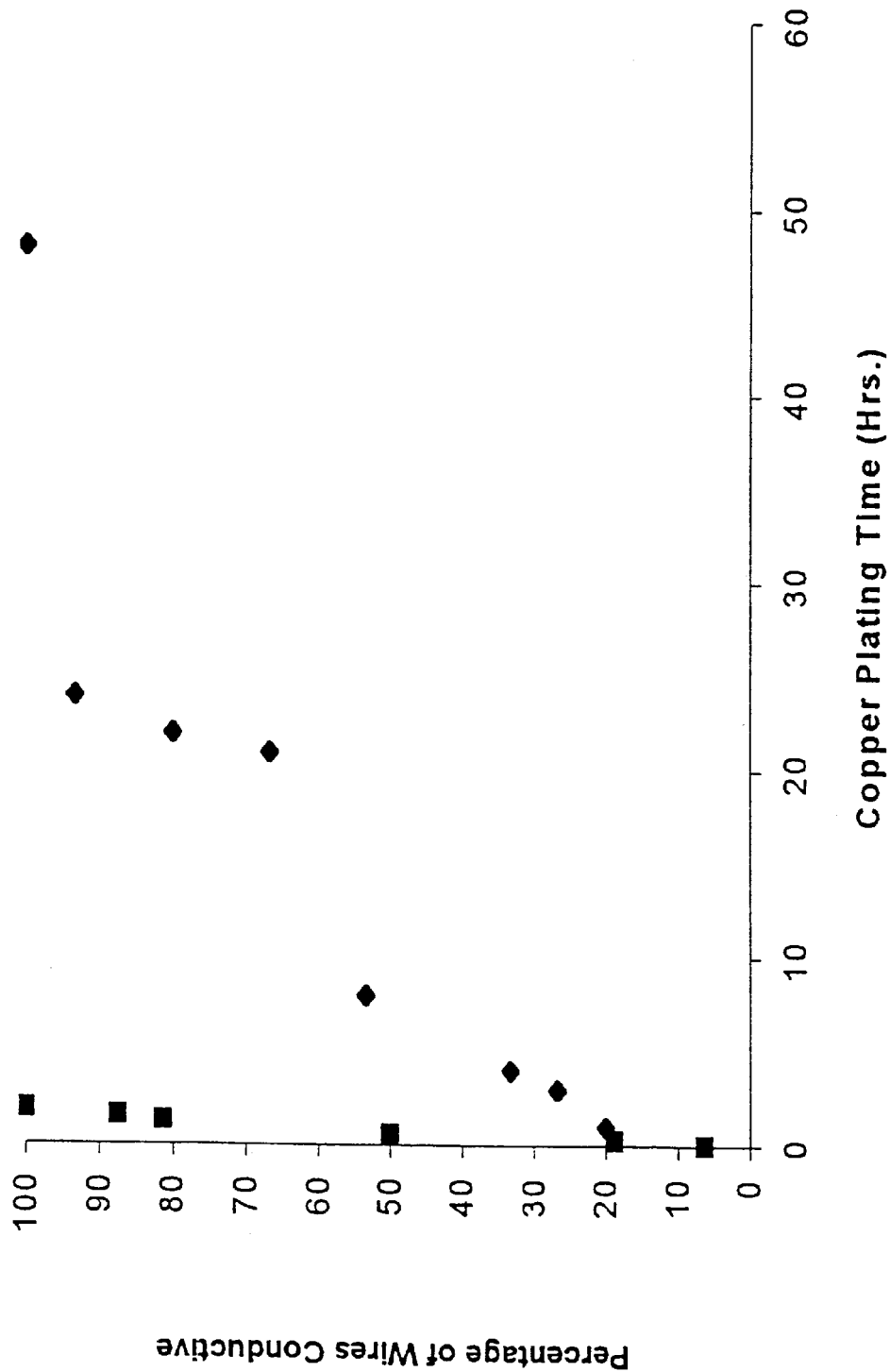
FIG. 3 is a graph showing the dependence of wire growth time with the applied external field, where the wire growth time is measured in seconds (s) and the applied field (E) is measured in volts per centimeter (V/cm).

This Example was to study, as illustrated in FIG. 3, the dependence of wire growth time with the applied external field. The spherical copper particles had an average diameter of 873±71 μm and the interparticle separation was 878±91 μm. The same conditions were used as described in Example 1, regarding FIGS. 2A–2H. The wire growth time corresponds to the interval between the application of the field and the formation of a wire connecting the two particles.

The growth time and wire morphology can be readily controlled by changing the applied field intensity. At fields less than 15 V/cm, no wire formed within a period of 5 minutes (see FIG. 3). A threshold field intensity for wire growth is expected, since a minimum overpotential must be reached to ensure copper electro-oxidation and water reduction on the surface of the particles. At higher field intensities, the wire growth time rapidly decreased, presumably reflecting the accelerating release of copper ions and the increased electrophoretic force on these ions towards the particle acting as cathode. Above about 35 V/cm, the wire growth time was not significantly reduced with increasing field intensities. Thus, above this field strength, growth speed is independent of voltage. Typical non-bipolar electrodeposition experiments are governed by a complex interplay of diffusion, migration and electroconvection. It is thus surprising to find a regime of wire growth speed independent of voltage, where intense and inhomogeneous fields near the particles appear to be inducing powerful and complex convective flows.

As expected from the proposed mechanism, initially, copper ions are generated by the anodic particle and do not yet cross the interparticle gap. During this induction period no visible phenomena can be observed. It must be stressed that this induction period is different than that observed in typical electrodeposition, which is thought to involve the building up of space charges or uniform deposition (V. Fleury, D. Barkey *Europhys. Lett.* 36:253 (1996); M. Z. Bazant, *Phys. Rev. E* 52:1903 (1995); R. H. Cork; D. C. Pritchard, W. Y. Tam *Phys. Rev. A* 44:6940 (1991); J. N. Chazalviel *Phys. Rev. A* 42:7355 (1990)). Wire growth then starts slowly and accelerates as the wire approaches the other particle where fields and copper concentrations are higher. Invariably, the wires had a fractal appearance, as expected for DLA (diffusion-limited aggregation or growth) (Fleury, V.; Kaufman, J. H.; Hibbert, D. B. *Nature* 367:435 (1994)).

At higher potentials, the wires grew more quickly until an asymptotic speed was reached. Even in this constant growth velocity regime the wires seemed to display reduced branching and consequently appeared increasingly thinner. Although difficult to resolve using light microscopy, the wire branches were estimated to be no more than a few microns in diameter.

EXAMPLE 3

Exemplary of the ability of SCBE to form microcircuits, this Example demonstrates the formation of wires in a particle array. As shown in the photomicrograph of FIG. 4, four spherical particles were arranged in a 4×4 particle array, in an aqueous medium containing water, acid ($H_2SO_4$, 0.01 mM), and surfactant (a nonionic surfactant, Nonidet-P40 (Sigma), 0.01%, to prevent hydrogen bubbles from sticking to the copper particles. The electrodes were two parallel 1 mm Pt wires separated by 1.5 cm. The direction of an electric field of 34.7 V/cm was changed to study the control of wire growth by changing the field direction. In FIG. 4A, the electric field vector was applied along the diagonal of the copper particle array, as illustrated by the arrow, generating a single wire in the expected location. The other two particles were left unaffected. In FIG. 4B, the electric field vector was applied along the sides of the particle array, as illustrated by the arrow, generating two parallel wires.

The results of the study of this Example establish that connections between selected particles were achieved by changing the direction of the electric field vector. By extending this concept to ordered three dimensional particle arrays, the construction of three dimensional circuitry can be realized, which will permit far denser information processing than that available from two dimensional lithographic techniques.

EXAMPLE 4

This Example relates to electropolymerization of a conductive electropolymer, exemplified by polypyrrole, onto a single gold particle.

A spherical gold particle (2.7 mm in diameter) was used. 1M pyrrole in 1:1 toluene:acetonitrile containing 1 mM sodium p-toluenesulfonate was used as the environment. An electric field was applied through two platinum wires (1 mm in diameter) positioned vertically in the solution in such a manner that the particle was generally aligned between the electrodes, where the electric field was expected to be maximal, but it is not necessary that there be exact alignment. The electrodes were positioned 1.5 cm apart, with voltages applied in the range of about 250 V to about 300 V, resulting in electric fields of about 167 V/cm to about 200 V/cm.

With the conditions described above, polypyrrole will form from the positively polarized region of the gold particle. See FIG. 5A (time=0 min.), FIG. 5B (time=5 min.). The voltage was 251 V.

EXAMPLE 5

This Example demonstrates electropolymerization between two gold particles using a single field direction, using the conditions of Example 4, with the following exceptions: two spherical particles were used (one 2.7 mm and the other 3.8 mm in diameter) and they were aligned with the direction of the electric field, the voltage was 300 V and the particle separation was 0.68 mm.

Figure 6:
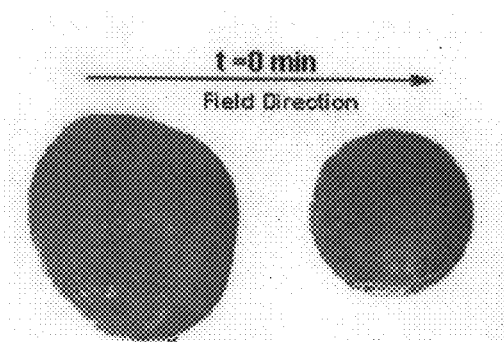
FIG. 6 is a photomicrograph depicting the starting condition for bipolar electrodeposition of polypyrrole between two gold particles under bipolar electrochemical conditions according to the present invention. The arrow indicates the field direction.
Figure 7:
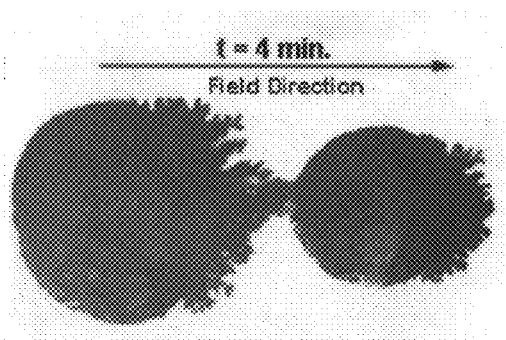
FIG. 7 is a photomicrograph depicting the bipolar electrodeposition of polypyrrole between the two gold particles depicted in FIG. 6 after four minutes. The arrow indicates the field direction.

An apparent contact is shown in FIG. 7 (time=4 min.) after exposing the particles in FIG. 6 (time=0 min.) to an electric field in the direction shown.

EXAMPLE 6

This Example demonstrates electropolymerization between two gold particles using the conditions of Example 4, with the following exceptions: two spherical particles were used (one 2.7 mm and the other 3.8 mm in diameter) the voltage was 250 V and the separation was 1.0 mm. The field direction was alternated with sequential exposure times of 1.5, 2.5 and 2.5 minutes.

Figure 8:
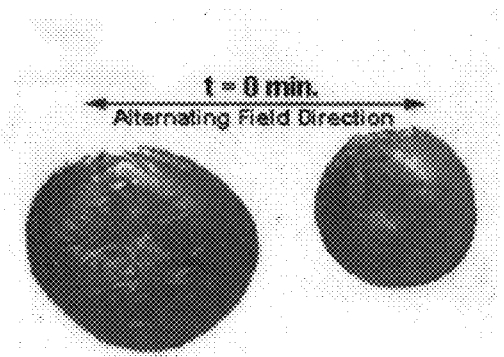
FIG. 8 is a photomicrograph depicting the starting condition for bipolar electrodeposition of polypyrrole between two gold particles under bipolar electrochemical conditions according to the present invention using alternating field directions as indicated by arrow.
Figure 9:
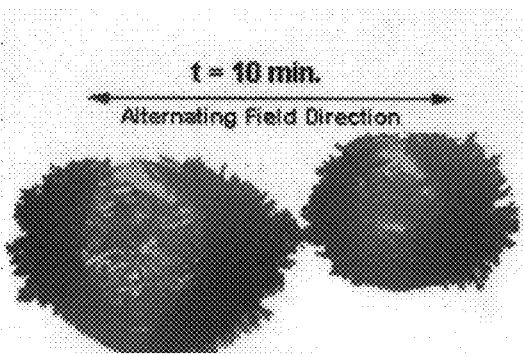
FIG. 9 is a photomicrograph depicting the bipolar electrodeposition of polypyrrole between the two gold particles depicted in FIG. 8 after four minutes.

An apparent contact is shown in FIG. 9 (time=10 min.) after exposing the particles in FIG. 8 (time=0 min.) to an alternating electric field in the direction shown.

EXAMPLE 7

Figure 10:
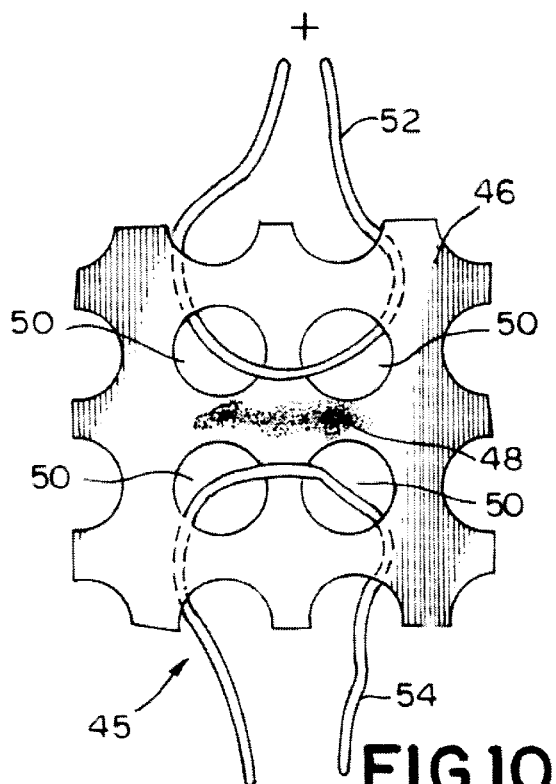
FIG. 10 is a schematic illustration of the threading of platinum wires through holes in a demetallized circuit board containing adherent copper particles in an area adjacent the holes through which the platinum wires are threaded. The arrangement is used in an electrochemical cell described in Example 7.

This Example demonstrates a technique involved in making a microcircuit by which SCBE-generated wires extend between spherical copper particles less than about 10 µm in diameter adhered to a dielectric circuit board. A commercial circuit board (Radio Shack, part number 276-158B) was completely demetallized with 50% nitric acid to present a convenient surface to immobilize powdered copper particles (Aldrich Chemical Co., spheroidal less than about 10 µm in diameter) simply by evaporating an acetone suspension of the powdered copper particles. Scanning electron micrographs reveal a surface roughness on the same order as the particles, which is presumably responsible for the tight binding. A schematic illustration of a demetallized circuit board assembly 45, prepared for use in this Example, is illustrated in FIG. 10. The adherent copper particles are depicted by shaded area 48. The circuit board 46 includes a number of holes 50 through which platinum wires 52 and 54 are threaded. Wire 52 is designated as the anode and the other wire 54 is designated as the cathode. The wires are fixed at a distance of 2 mm apart on the side of the circuit board carrying the copper particles.

Figure 11:
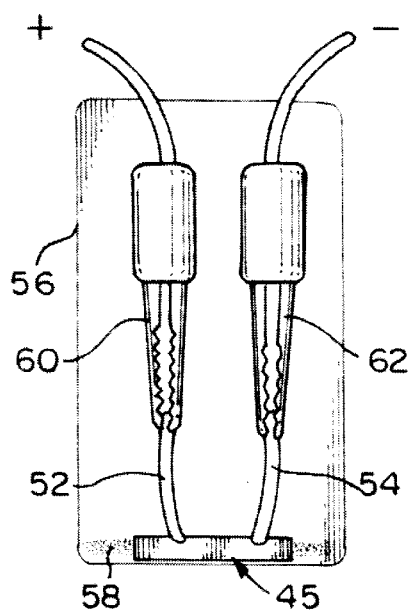
FIG. 11 is a schematic representation of the electrochemical cell described in Example 7.

FIG. 11 illustrates a schematic arrangement for a bipolar electrolytic cell containing the circuit board assembly 45. A glass container 56 contains enough of the organic medium 58 used in this Example to cover the portion of the wires 52 and 54 and about half the thickness of the circuit board 46 when the circuit board assembly 45 is inverted and placed in the glass container 56. The organic medium is a mixture of 50 vol % acetonitrile and 50 vol % toluene. Alligator clips 60 and 62 are used to provide electrical connections to the anode wire 52 and cathode wire 54, respectively. A voltage supply (Bertan, maximum voltage 1000 V @ 4.6 mA) was used to generate fields up to 5000 V/cm. Placing the board in a glass vial with the adherent particles facing down allowed real-time optical microscopy observation of gross changes in the electrochemical cell.

Figure 12A:
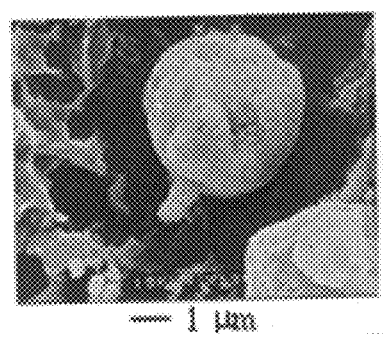
FIG. 12 comprises photomicrographs FIGS. 12A–12D depicting the growth of wires extending from particles as explained in Example 7. Bars under each figure indicate the respective scale used in the figure, in microns ($\mu$m).
Figure 12B:
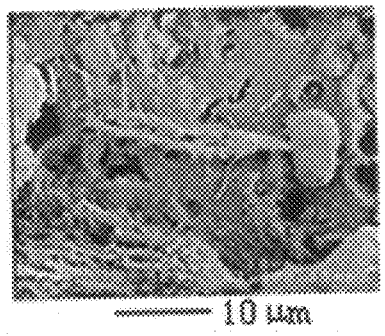
Figure 12C:
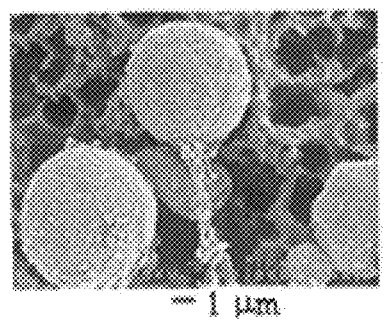
Figure 12D:
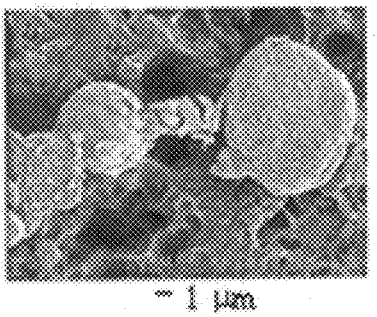

Monitoring the evolution of the system by optical microscopy was a very convenient method of initially screening the effectiveness of a particular solvent for wire formation. Although the smallest wires were beyond the resolution of the technique, in regions where clumps of particles were present, larger wires could be observed to form. Scanning electron microscopy (SEM) revealed the formation of a rod-like deposit, formed after 5 minutes of exposure to an applied electric field of 2.5 kV/cm, as shown in FIG. 12A. Rope-like deposits stretching several particle diameters from the cathodically polarized side of the particles are shown in FIGS. 12B and 12C. The deposit in FIG. 12B formed after a 10-minute exposure to an applied electric field of 2.5 kV/cm, while the deposit in FIG. 12C formed after a 5-minute exposure to an applied electric field of 5.0 kV/cm. The smallest deposits had diameters of about 0.3 µm. When two adjacent particles were aligned with the field, a wire formed in the interparticle space apparently connecting the two structures (FIG. 12D). Electrical contact between the two particles cannot be ascertained using the methods described herein.

This Example demonstrates that SCBE allows the growth of conductive structures on isolated components with the location of the growth controlled by the electric field direction. Moreover, the present invention can form sub-micron wires either bridging two particles, or attached to a single particle generating extended rope-like deposits. The method requires no lithographic techniques and can be performed within a few minutes at room temperature. This Example supports a conclusion that SCBE would be useful for spatially directed wire growth in three dimensional particle arrays, given a proper electrode configuration and porous matrix.

EXAMPLE 8

This Example demonstrates the formation of an electric circuit using SCBE to form wires between copper rings on a circuit board, and thereafter plating the formed wires with copper from an electroless copper plating bath.

Figure 13:
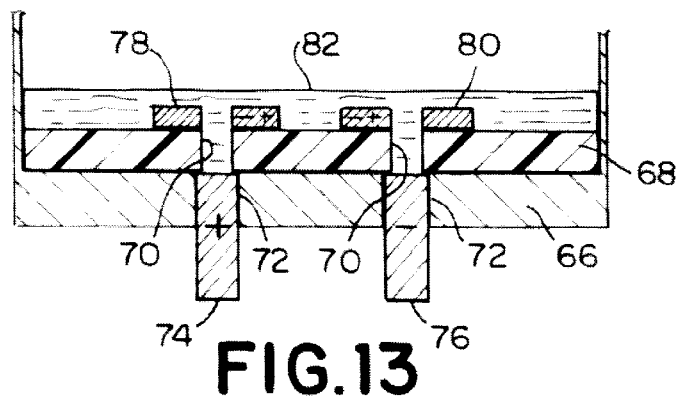
FIG. 13 is a schematic illustration, in vertical cross-section, of the arrangement of components within an electrolytic cell described in Example 8.

FIG. 13 schematically illustrates the components of a bipolar electrolytic cell 64 to be contained within a suitable container. The cell 64 comprises an inert platform 66 made out of a dielectric material such as TEFLON® fluorocarbon or other similar chemically and electrically inert material. A dielectric printed circuit board 68 (Radio Shack Part No. 276-158B) is supported by the platform 66. The board 68 has a plurality of holes 70. Located between two of the holes 70 and extending through holes 72 in the platform 66 are platinum electrodes, one being an anode 74 and the other being a cathode 76. In this design, the tops of the electrodes extend only to the bottom of the printed circuit board 68, although in other designs (see Example 9, e.g.), the electrodes extend within the holes 70 of the printed circuit board 68.

Located on top of the circuit board 68 are an array of copper rings, two of which are identified as rings 78 and 80. Ring 78 is generally aligned with, but not in contact with, anode 74. Ring 80 is generally aligned with, but not in contact with, cathode 76. An aqueous medium 82 covers the surface of the board 68 and the rings 78 and 80, and fills the holes 70 in the circuit board 68 where the medium contacts the electrodes 74 and 76. The aqueous medium is the same as that used in Example 1 with respect to FIGS. 2A–2H.

Figure 14:
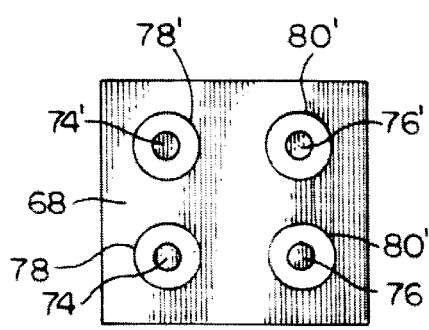
FIG. 14 is a top plan view of one embodiment of an arrangement as illustrated in FIG. 13 using circular copper rings.
Figure 15:
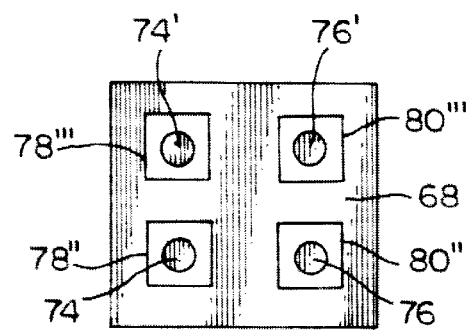
FIG. 15 is a top plan view of another embodiment of an arrangement as illustrated in FIG. 13 in which the rings have a rectangular outer periphery with a circular hole.

As shown in FIG. 14, a schematic top view of a 2×2 array of rings on a circuit board as illustrated in FIG. 13, the rings are in the form of annular rings 78, 78', 80 and 80'. Electrodes 74, 74', 76 and 76' are also visible in FIG. 14. Some of the copper rings also have the shape of a square ring as illustrated in the top schematic view of FIG. 15. Thus, FIG. 15 shows the circuit board 68, square copper rings 78" and 78'" and electrodes 74, 74', 76 and 76'. Both circular and square rings were found to be suitable to form electrical contacts. Ring shape does impact the growth behavior to some extent. For circular rings, contact always occurred along the shortest path. For square rings, the conductive path had a strong tendency to grow in the space between corners. Nevertheless, suitable growth occurred using rings of both shapes.

With reference to FIG. 13, when an electric field was applied to the electrodes 74 and 76, rings 78 and 80 became polarized as noted by the plus and minus symbols on the respective rings. In the region between the rings, electrodissolution of copper occurs from the anodically polarized ring 78, while growth of the deposit occurs from the cathodically polarized ring 80.

Figure 16A:
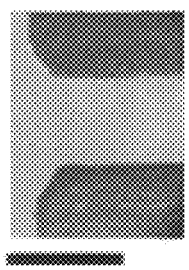
FIG. 16A depicts two square rings before application of an electric field.
Figure 16B:
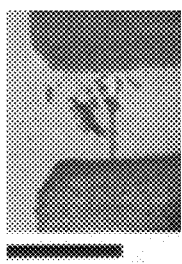
FIG. 16B shows the same two rings after application of a 20 V/cm field for 4.5 seconds between the two rings, followed by drying for 15 minutes.
Figure 16C:
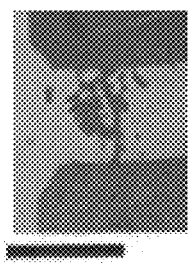
FIG. 16C shows the rings and wire after 21 hours of electroless copper plating.
Figure 16D:
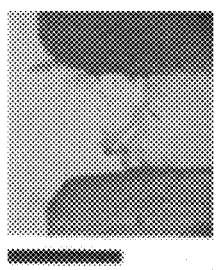
FIG. 16D depicts two other rings showing a two dimensional deposit.
Figure 16E:
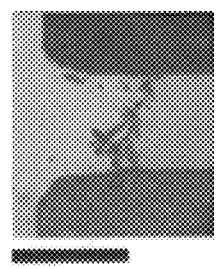
FIG. 16E shows the deposit between the rings in FIG. 16D after 4 hours of electroless copper plating.
Figure 16F:
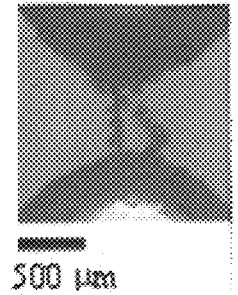
FIG. 16F shows the formation of a conductive wire formed between two circular rings after electroless copper plating. The bars below each of FIGS. 16A–16F indicate a scale of 500 $\mu$m.

FIG. 16 comprises photomicrographs FIGS. 16A–16F showing a top view of the formation of wires between the rings which were made more robust by electroless plating of copper. FIG. 16A depicts two square rings before application of an electric field. FIG. 16B shows the same two rings after application of a 20 V/cm field for 45 seconds between the two rings, followed by drying for 15 minutes. A three dimensional copper wire adheres to the circuit board. FIG. 16C shows the rings and wire after 21 hours of electroless copper plating. The wire is far more robust and establishes electrical contact between the two rings. FIG. 16D depicts two other rings showing a two dimensional deposit without any electroless plating applied. FIG. 16E shows the deposit between the rings in FIG. 16D after 4 hours of electroless copper plating. After plating, the wire is conductive and can withstand handling. FIG. 16F shows the formation of a conductive wire formed between two circular rings after electroless copper plating. The electroless copper plating was applied by depositing the dried circuit board with the deposited wire adhered to it in an electroless copper plating bath (EC-70, available from Technics, Inc., Cranston, R.I.), over the course of three hours.

Figure 17:
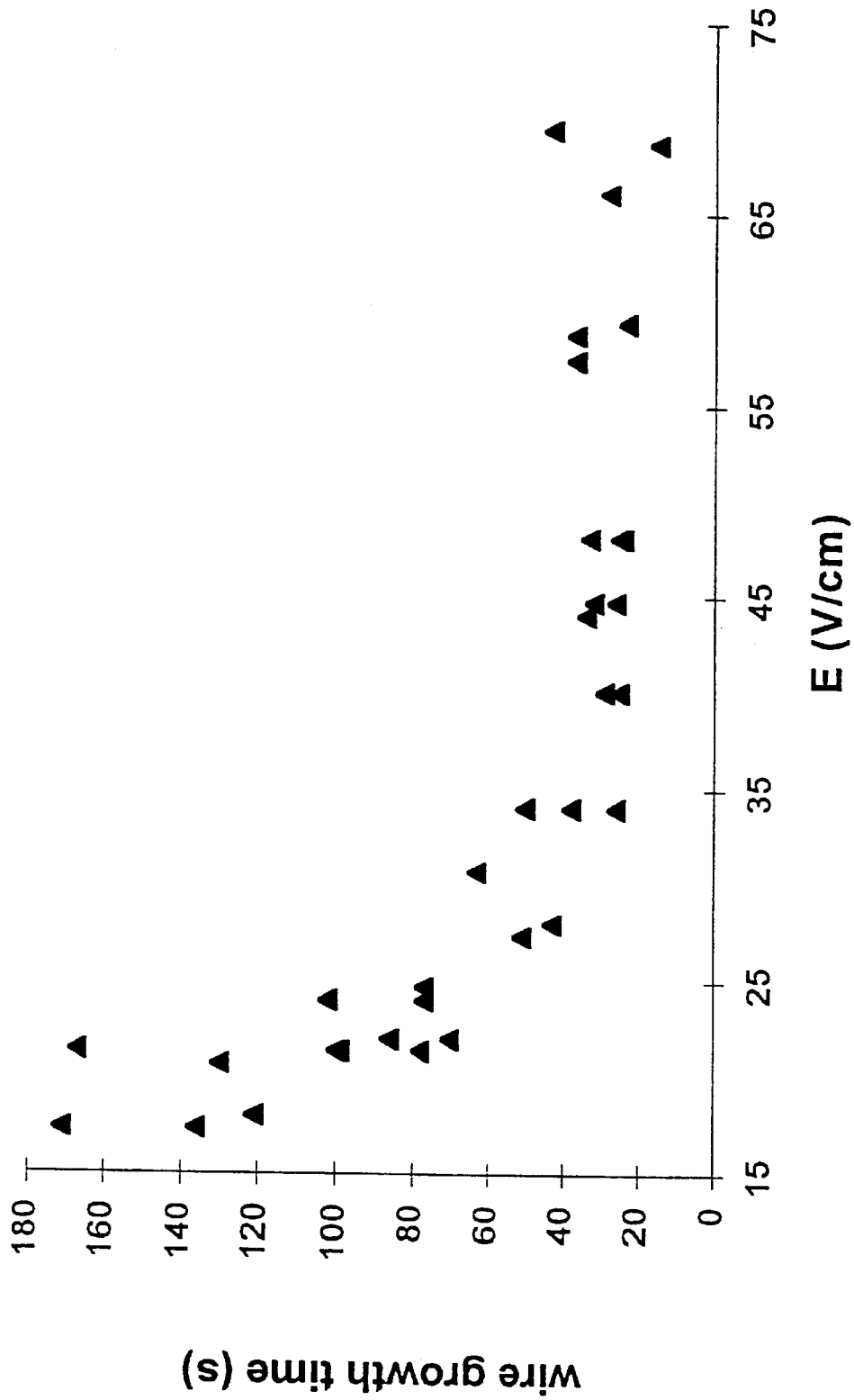
FIG. 17 is a graph showing the percent of wires that were conductive versus electroless copper plating time as explained in Example 8.

Conductivity measurements taken between the rings during the course of the electroless plating process indicated that electrical contact was achieved for most of the fifteen sets of wires tested within eight hours. This data is graphed in the graph of FIG. 17 which shows percentage of wires that were found to be conductive versus the electroless copper plating time.

Figure 18:
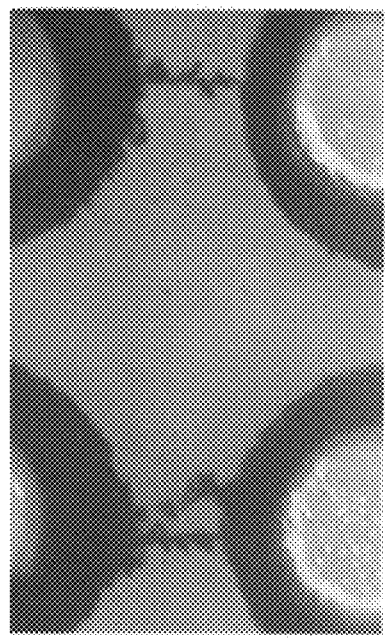
FIG. 18 is a photomicrograph showing an enlarged view, on the left-hand side of the connection between two circular rings as depicted in FIG. 16F, but also depicting the formation of a wire between an adjacent pair of rings. This arrangement was used to create an electric circuit as explained in Example 8.

FIG. 18 is a photomicrograph of a top view of an example of two parallel conductive wires grown simultaneously from circular copper rings according to this Example 8. Lead wires from a light-emitting diode (LED) were attached across the top pair of rings. When current was applied across the bottom pair of rings, the LED was illuminated, forming an elementary circuit and demonstrating the conductivity of the wires formed by SCBE.

This example demonstrates the novel method of the present invention of creating electrical contacts between copper rings on a commercial circuit board relying on SCBE which avoids the need to physically contact the metallic components in the system. The growth of the wires is mediated by the electric field and the wires were made sufficiently robust to be useful by electroless plating. The metallic paths formed by the SCBE wire growth before plating serve as templates for the electroless deposition step which yields robust and adherent electrical connections.

EXAMPLE 9

Figure 20:
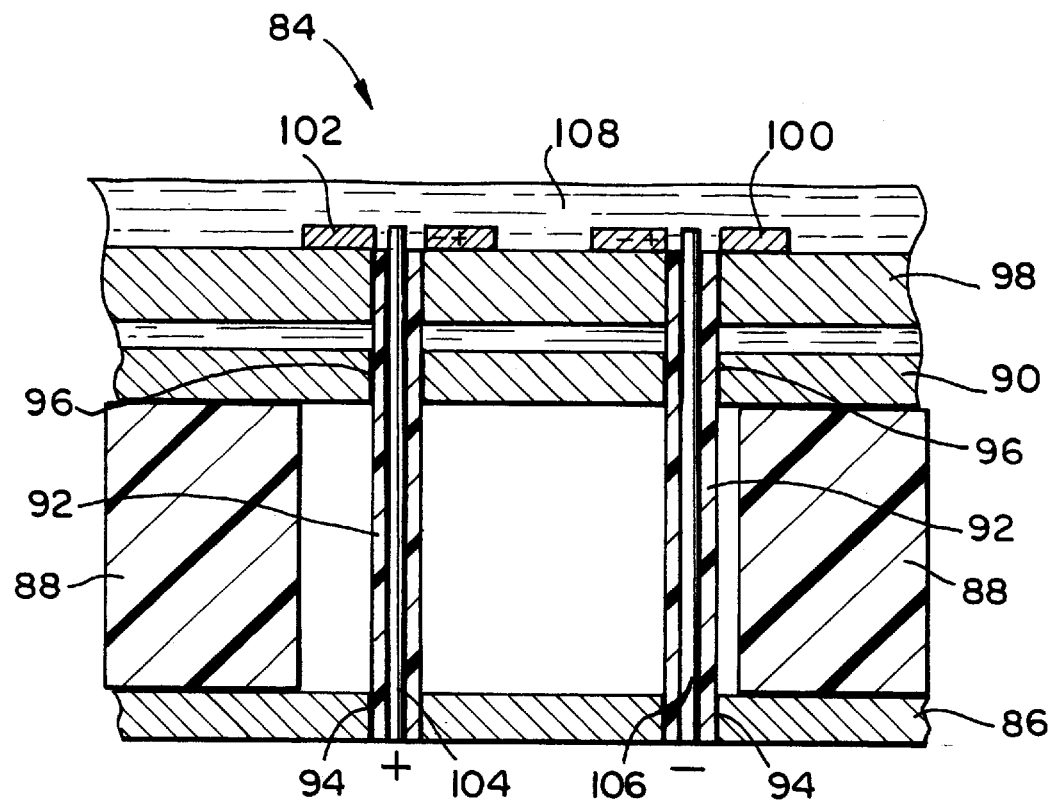
FIG. 20 is a schematic illustration, in vertical cross-section, of an electrochemical cell using SCBE to form wires between square copper rings.

This example demonstrates circuit growth using the SCBE principle schematically illustrated in FIG. 19. FIG. 20 schematically illustrates a cross sectional view of an electrolytic cell arrangement 84 used in the experiments of this example. The apparatus 84 includes a demetallized circuit board 86 (Radio Shack, part number 276-158b) demetallized for five minutes in 50% nitric acid as a base support. Circuit board 86 had dimensions of 20 mm×36 mm. Two Teflon® polymer blocks 88 measuring 9 mm×20 mm×6 mm (in height) were placed on the circuit board 86. A second demetallized circuit board 90 was placed on top of the Teflon® blocks 88. The circuit boards were attached to the Teflon® blocks by nylon screws, one on the top and two on the bottom. To assure alignment of the circuit boards and prevent movement, two Teflon® posts (not shown) were run through holes 94 in the base circuit board 86 and holes 96 in the upper circuit board 90. This arrangement allowed consistent alignment of the electrodes and added structural strength to the thin platinum wire electrodes by fixing them in the holes of the dielectric circuit boards. It is important to avoid any metal components in the support structure of the apparatus 84 to avoid distortion of electric fields and to avoid unwanted wire growth caused by the metal components.

Figure 21:
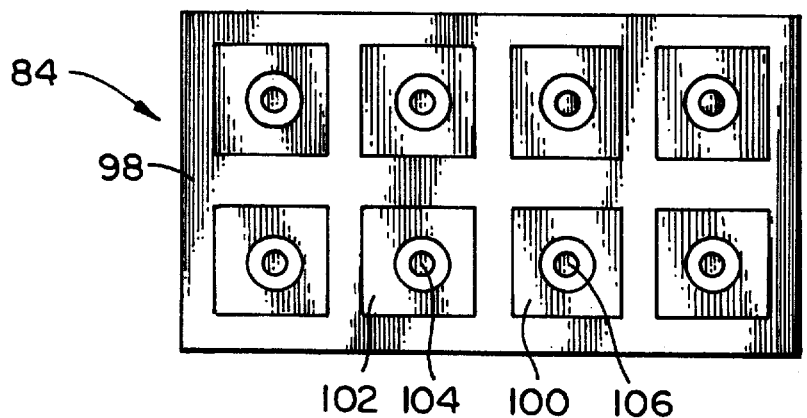
FIG. 21 is a top plan view of the apparatus of FIG. 20.

A bare dielectric circuit board 98 provides direct support for a number of square copper rings exemplified in FIG. 20 by rings 100 and 102. The square copper rings measure 2 mm×2 mm and are spaced 0.5 mm apart. They have 1 mm diameter unplated holes extending through them. The boards were cut down to sections four squares wide by six squares long and placed on an array of platinum pins (2×4). The pins form electrodes exemplified in FIG. 20 by anode 104 and cathode 106. Each electrode, a 0.25 mm diameter platinum wire obtained from Aldrich Chemical Co., was coated with Teflon® insulation 92 up to the point where it went through the upper surface of the bare dielectric board 90. Above the bare dielectric board 90, approximately 1.5 mm of the electrode extended uninsulated. Care was taken to ensure that the electrodes were in the center of each respective hole and not touching any side. The electrodes were also checked to ensure that each came to the exact height of the copper ring 100 or 102 supported by the dielectric circuit board 98. FIG. 21 shows a top plan view of the arrangement (using the 2×4 array of platinum electrode pins through square rings) wherein only some of the components are labeled, the unlabeled components being identical to those which are labeled.

The entire system 84 was then immersed in a solution (labeled as 108 in FIG. 20) of 60/40 toluene/acetonitrile (distilled from calcium hydride and changed for each new growth unless stated otherwise). A power supply (Bertan Associates Inc. model PMT-10A/option 3, rated for 0–1000

V @ 4.6 mA DC) was used to deliver the field across the desired pins. Resistance measurements were made by measuring the voltage drop across a 1000 ohm resistor in series with the circuit. Light emitting diodes (LEDs) were obtained from Radio Shack (part number 276-208) and were soldered to the circuit boards prior to circuit growth. Electroless copper plating solution (EC-70) was obtained from Technics Inc.

Wire growth proceeded smoothly in the selected non-aqueous media. A 60/40 toluene/acetonitrile mixture was found to be a particularly convenient solvent system since its high resistivity allowed very high fields (greater than 5000 V/cm) to be applied while still inducing wire growth. Acetonitrile alone proved to be less desirable because it prevented exploration of high field regimes due to excessive conductivity. Pure toluene was not effective probably because of the inability to solvate and transport copper ions.

As noted above, this organic system differed markedly from the aqueous system in that growth did not cease in the organic system after the first wire spanned the inter-ring space. Regardless of the nature of the initial contact, subsequent electroless plating yields connections which are of suitable quality for forming robust electric circuits. However, any minor breaks along the single wire formed in aqueous systems lead to extremely long plating times to bridge the gap and form a robust connection.

Figures 22A, 22B, 22C:
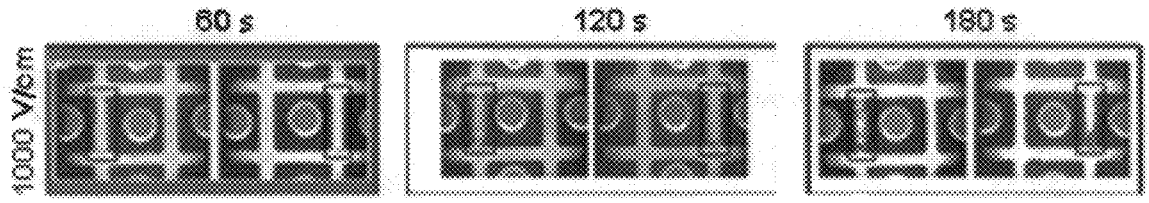
FIG. 22 comprises photomicrographs, FIGS. 22A–22I, arranged in a matrix to show the results of wire growth between square copper rings which occurs at the indicated field strengths for the indicated periods of time. A bar indicates the scale of 2 millimeters (mm).
Figures 22D, 22E, 22F:
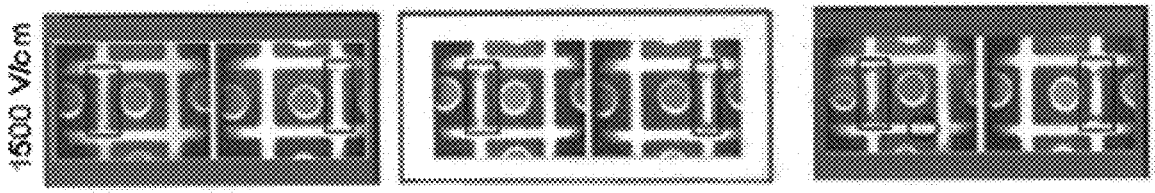
Figures 22G, 22H, 22I:
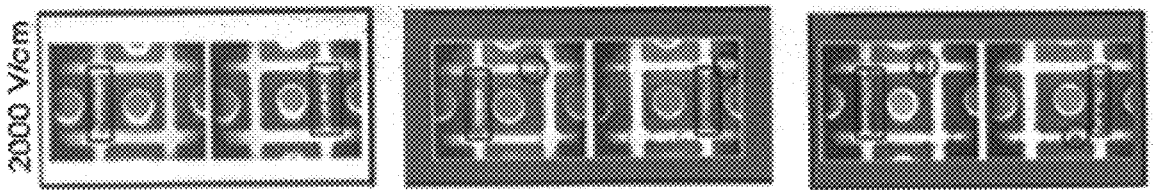

FIG. 22 comprises FIGS. 22A–22I, which are photomicrographs of boards with wires grown at various electric field intensities and durations according to this Example 9. Two samples are shown in each case. The wires were grown in one direction for half the time indicated, then the field direction was reversed for the same amount of time. The solvent was replaced with fresh solution before every growth. Rectangles in each of FIGS. 22A–22I indicate areas of desired wire growth. Circles in FIG. 22F (left sample), FIG. 22H (left sample) and FIG. 22I (both samples) indicate unwanted side branching. FIGS. 22B, C, E and G represent acceptable wire growth with selectivity. For FIGS. 23A and D, the fields were not intense enough or of sufficient duration for acceptable wire growth to occur. In FIGS. 22F, H and I, excessive growth caused a loss of selectivity.

As illustrated by the results of FIG. 22, clearly the highest fields are to be found between the desired adjacent rings on the circuit board. However, other rings will experience fields of varying intensity and unwanted side growths are found at high fields or long exposures. Since a critical field intensity is needed to ensure adequately thick growth across the inter-ring gap, there will exist a regime of time and intensity where wires grow at the desired positions with no unwanted side-growths. Such conditions are shown in FIG. 22 and correspond to 120 s or 180 s at 1000 V/cm, 120 s at 1500 V/cm or 60 s at 2000 V/cm. In these experiments the growths were carried out by switching the polarity of the field at the midpoint of the wire growth. This approach was taken to increase the "intermingling" of wires from each ring, thus increasing the number of potential contact points.

The wires have a strong tendency to grow initially between the edges of the square copper rings, as is most obvious in FIGS. 22E and F. At higher fields, the entire inter-ring space becomes filled with copper deposits (see FIGS. 22G, H and I). When circular rings are used, wire growth proceeds as expected following the shortest path.

EXAMPLE 10

Figure 23:
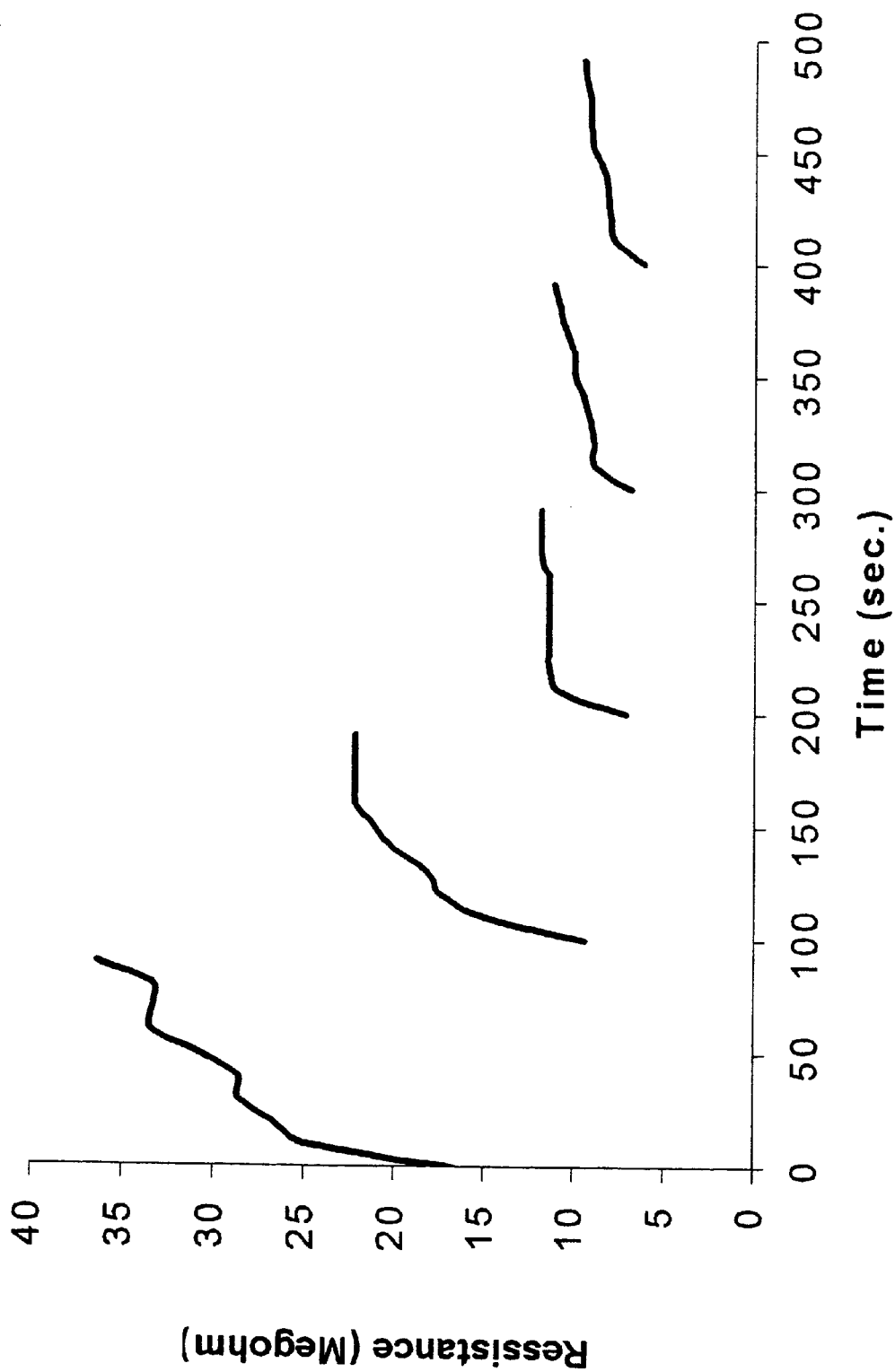
FIG. 23 is a graph of resistance between two platinum pin electrodes versus the time of wire growth for five wires grown in the same solution.

This example relates to resistance measurements of the solution used to make the circuits formed in Example 9. By measuring the voltage drop across a resistor placed in series between the voltage supply and the platinum pins, resistance measurements of the cell could be made during the application of the electric field. The resistance between the two platinum pin electrodes of each pair was measured as five wires were grown in the same solution. After each wire growth the starting resistance of the solution decreased, as shown in FIG. 23. This is expected since copper ions are presumably being injected into the solution during each growth. During the course of a wire growth the resistance was observed to increase. When a new circuit board was introduced and wire growth re-initiated, the measured resistance was substantially less than at the end of the previous growth. The cause of this behavior has not been elucidated. Due to this variability, in order to ensure the most reproducible results the solution was changed before every growth.

EXAMPLE 11

Figure 24A:
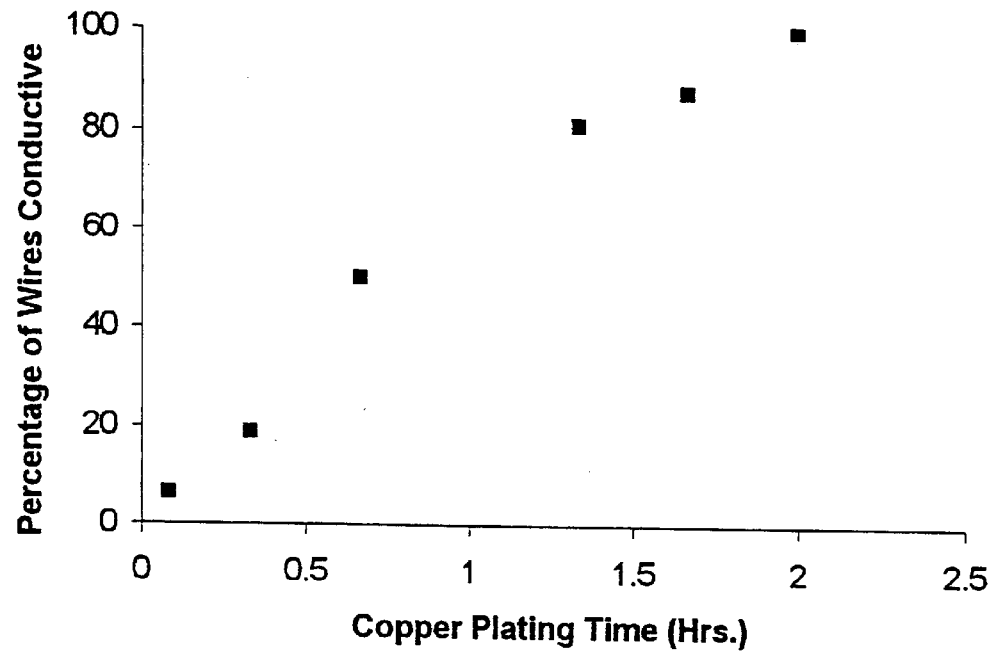
FIG. 24 comprises graphs of FIG. 24A and FIG. 24B showing the percentage of wires that are conductive versus plating time of electroless copper plating of wires formed between square copper rings using an organic medium.
FIG. 24B shows a percentage of wires that are conductive versus copper plating time for two sets of wires formed in two different systems. The squares of FIG. 24B represent the squares of FIG. 24A (but on the scale of FIG. 24B). The diamond points of FIG. 24B relate to the results obtained from growing wires in water, rather than an organic solvent.
Figure 24B:
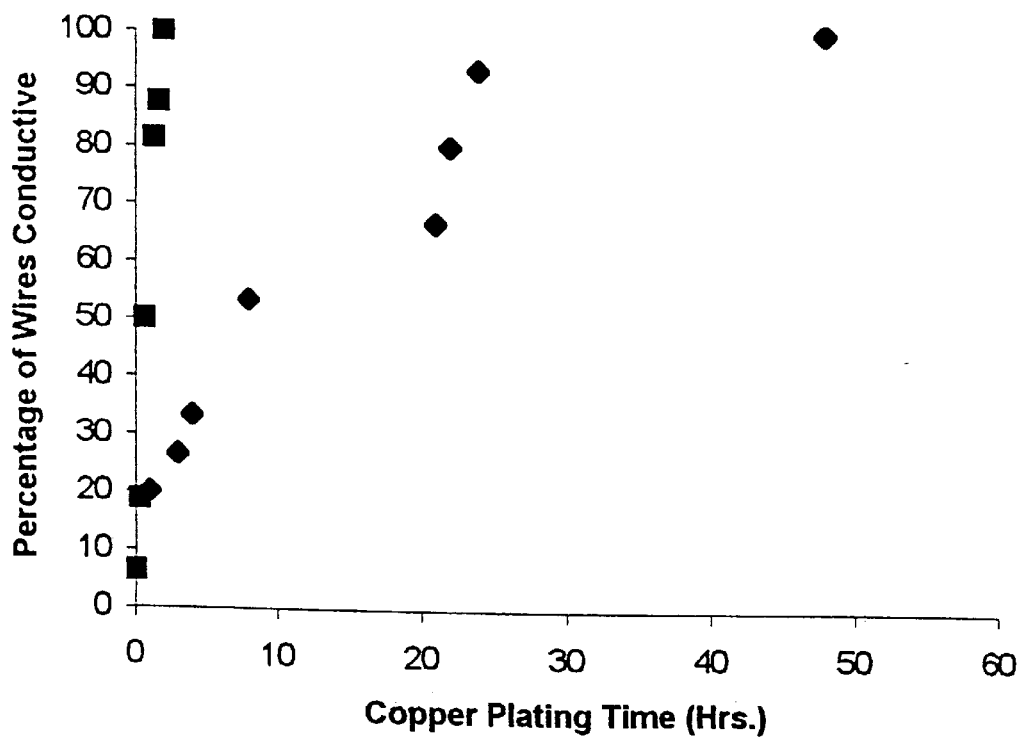

This example compares plating time of wires formed using aqueous solutions according to Example 1 with the plating time of wires formed using organic solutions according to Example 9. The graph of FIG. 24A shows the results from 16 wires grown under conditions in Example 9. The electroless copper solution was not stirred. Conductivity was claimed when the resistance fell below 1 ohm. The graph of FIG. 24B shows a comparison of the results in FIG. 24A (squares) and those obtained from wires grown in the aqueous solution used in Example 1, regarding FIGS. 2A–H (diamonds).

Although extremely thick bushes can be grown between adjacent rings in organic solution, we have never found these to be initially conductive when removed from the bath and dried. However, exposure to a commercial electroless copper solution will form robust connections between the rings. As shown in FIG. 24A, the time required to achieve conductivity is reduced by an order of magnitude when the wires are grown from the organic instead of the aqueous system. Some of the connections were conductive within a few minutes and all within 2 hours. For the wires grown in aqueous solution, up to 48 h were necessary for conductivity of all wires. This is almost certainly the result of the far greater number of potential contact points generated from growth in a nonaqueous environment.

EXAMPLE 12

Figure 25A:
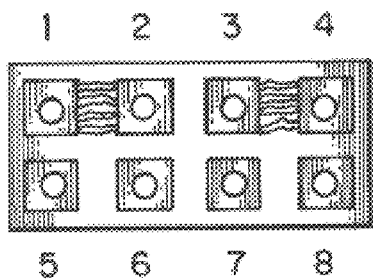
FIG. 25 comprises schematic drawings FIGS. 25A and 25B and photomicrographs FIGS. 25C and 25D. The schematic drawing of wire patterns in an 8-pin array shown in FIG. 25A are shown to have occurred in FIG. 25C. Likewise, the schematic drawing of wire patterns in an 8-pin array shown in FIG. 25B are shown to have occurred in FIG. 25D.
Figure 25B:
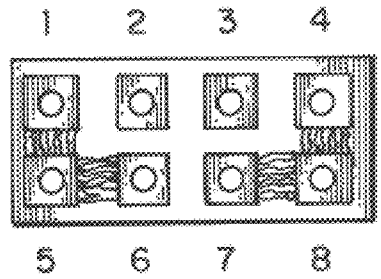
Figure 25C:
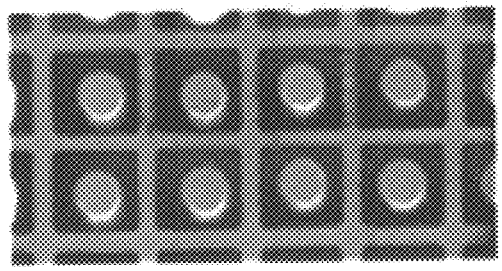
Figure 25D:
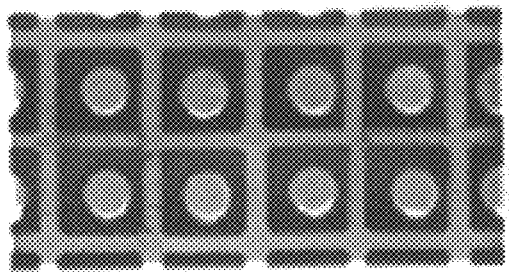

This example demonstrates the use of SCBE in selective circuitry formation. Using the parameters established to obtain selectivity in wire growth, two different patterns were constructed. The patterns in FIGS. 25A and B were grown by activating the appropriate pins to generate the wires as shown in the photomicrographs of FIGS. 25C and D. The conditions used were those of Example 9 as shown in FIG. 22C, namely 1000 V/cm applied for 180 s, in an organic solution of 60%:40% toluene/acetonitrile. After 2 hours of electroless plating, the connections shown were fully conductive (less than 1 ohm). To further demonstrate the versatility of the method, the same circuits were grown on two circuit boards with pre-soldered leads at positions 1 and 4 and diodes (not illustrated) spanning positions 2–3 and 6–7. The patterns of FIGS. 25A and B were grown in the presence of these components to generate the circuits shown as photomicrographs in FIGS. 25C and D, respectively. In this case, conductivity is demonstrated by the correct lighting of one diode or the other depending upon the programming of the wire growth, upon connecting the lead wires to a power source.

The application of SCBE to the construction of selective circuitry has been achieved with significant improvements over the procedure of Example 8. In principle, the 8-pin array used in Example 9 and this Example 12 should be extendible to vastly larger arrays which would allow the construction of far more complex circuitry. The ability to connect pre-soldered components into functional circuitry is significant because it provides a method to program the hard-wiring of circuitry by an automation process simply by activating desired pins on circuit boards containing a standard array of electronic components. In addition, because SCBE is a contactless and room temperature technique, it would be applicable in situations where soldering and photolithography are problematic.

It will be appreciated by those skilled in the art that changes could be made to the embodiments described above without departing from the broad inventive concept thereof. It is understood, therefore, that this invention is not limited to the particular embodiments disclosed, but it is intended to cover modifications within the spirit and scope of the appended claims.

What is claimed is:

1. A bipolar electrochemical process for toposelective formation of an electrically conductive structure between at least two substrates comprising (a) placing a source of electrically conductive material and the substrates into an environment capable of conducting electricity and containing electrodes; (b) aligning the substrates with respect to the electrodes such that the electrodes are not in contact with the substrates and such that the material will form a conductive structure between and in contact with at least one of the substrates when an electric field is applied between the electrodes; and (c) applying a voltage to the electrodes to create an electric field of a sufficient strength between the electrodes and for a time sufficient to form the electrically conductive structure between and in contact with at least one of the substrates, the electrically conductive structure being substantially aligned with the electric field.

2. A bipolar electrochemical process for toposelective formation of a solid electrically conductive structure between at least two substrates on a circuit board, at least one of the substrates comprising a source of electrically conductive material, the process comprising (a) placing the circuit board and the substrates into an environment capable of conducting electricity and containing electrodes; (b) aligning the substrates with respect to the electrodes and the circuit board such that the electrodes are not in contact with the substrates and such that the material will form a solid electrically conductive structure between and in contact with at least one of the substrates on the circuit board when an electric field is applied between the electrodes; and (c) applying a voltage to the electrodes to create an electric field of a sufficient strength between the electrodes and for a time sufficient to form on the circuit board the solid electrically conductive structure from the substrate comprising the source of electrically conductive material, the solid electrically conductive structure extending toward the substrate comprising the source of electrically conductive material, the solid electrically conductive structure being between and in contact with at least one of the substrates, the solid electrically conductive structure being substantially aligned with the electric field.

3. The process of claim 2 further comprising removing from the environment the circuit board containing the substrates and the conductive structure between the substrates and electrolessly plating an electrically conductive material onto the electrically conductive structure until a desired thickness of the electrically conductive material is obtained.

4. The process of claim 3 wherein the electrolessly plated electrically conductive structure is in contact with at least two of the substrates.

5. The process of claim 2 wherein the environment is a liquid environment, the process further comprising removing from the environment the circuit board containing the substrates and the electrically conductive structure between the substrates, drying the electrically conductive structure between the substrates, and electrolessly plating an electrically conductive material onto the electrically conductive structure until a desired thickness of the electrically conductive material is obtained.

6. The process of claim 5 wherein the electrolessly plated electrically conductive structure is in contact with at least two of the substrates.

7. A bipolar electrochemical process for toposelective formation of an electrically conductive structure between at least two substrates, at least one of the substrates comprising a source of electrically conductive material, the process comprising (a) placing the substrates into an environment capable of conducting electricity and containing electrodes; (b) aligning the substrates with respect to the electrodes such that the electrodes are not in contact with the substrates and such that the material will form a conductive structure between and in contact with at least one of the substrates when an electric field is applied between the electrodes; and (c) applying a voltage to the electrodes to create an electric field of a sufficient strength between the electrodes and for a time sufficient to form from the substrate comprising the source of electrically conductive material, the electrically conductive structure between and in contact with at least one of the substrates, the electrically conductive structure extending toward the substrate comprising the source of electrically conductive material, the electrically conductive structure being substantially aligned with the electric field.

8. The process of any one of claims 1, 2 and 7, wherein the source of the electrically conductive material is selected from the group consisting of a metal ion, a monomer which is electropolymerizable into a conductive polymer and an organic salt which is electrocrystallizable into a conductive crystal.

9. The process of claim 8 wherein the source of electrically conductive material is an ion selected from the group consisting of Cu, Ag, Au, Pd, Pt, Co, Ni, Zn, In, Ga, Fe, Pb, Al, W, Ir, Cr, Cd, Re, Os, Mn and Sn.

10. The process of claim 9 wherein the source of electrically conductive material is an ion selected from the group consisting of Cu and Ag.

11. The process of any one of claims 1, 2, and 7 wherein each substrate is independently selected from the group consisting of a metal, a metal oxide, a conductive polymer, a conductive organic salt crystal, a conductive form of carbon, and a doped semiconductor material.

12. The process according to claim 11 wherein the doped semiconductor material is selected from the group consisting of Si, InP, GaAs, CdS and CdSe.

13. The process of claim 11 wherein each substrate is independently selected from the group consisting of Cu, Ag, Au and Pt.

14. The process of any one of claims 1, 2, and 7 wherein the environment is selected from the group consisting of a liquid and a gel, the environment having a dielectric constant lower than the dielectric constant for the substrate, the environment further being able to solvate the electrically conductive material in a form in which the material can electrodeposit onto the substrate to form the electrically conductive structure upon application of an electric field.

15. The process of claim 14 wherein the environment is aqueous.

16. The process of claim 15 wherein the aqueous environment comprises water, an acid to remove oxides and a surfactant to prevent adhesion of gas bubbles.

17. The process of claim 14 wherein the environment comprises an organic solution.

18. The process of claim 17 wherein the organic solution is selected from the group consisting of acetonitrile and a mixture of toluene and acetonitrile in which the toluene is present in an amount of up to about 80 volume percent.

19. The process of any one of claims 1, 2, and 7 wherein each electrode comprises a material that will not electrodissolve in the environment.

20. The process of claim 19 wherein each electrode is independently selected from the group consisting of platinum, gold and graphite.

21. The process of claim 1 or 7 further comprising removing from the environment the substrates and the conductive structure between the substrates and electrolessly plating an electrically conductive material onto the electrically conductive structure until a desired thickness of the electrically conductive material is obtained.

22. The process of claim 21 wherein the electrolessly plated electrically conductive structure is in contact with at least two of the substrates.

* * * * *